(12) United States Patent
Liu et al.

(10) Patent No.: US 9,959,920 B2
(45) Date of Patent: May 1, 2018

(54) APPARATUS AND METHODS FOR MEMORY USING IN-PLANE POLARIZATION

(71) Applicants: Junwei Liu, Cambridge, MA (US); Kai Chang, Halle/Saale (DE); Shuai-Hua Ji, Beijing (CN); Xi Chen, Beijing (CN); Liang Fu, Winchester, MA (US)

(72) Inventors: Junwei Liu, Cambridge, MA (US); Kai Chang, Halle/Saale (DE); Shuai-Hua Ji, Beijing (CN); Xi Chen, Beijing (CN); Liang Fu, Winchester, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days. days.

(21) Appl. No.: 15/453,548

(22) Filed: Mar. 8, 2017

(65) Prior Publication Data

US 2017/0301385 A1 Oct. 19, 2017

Related U.S. Application Data

(60) Provisional application No. 62/304,986, filed on Mar. 8, 2016.

(51) Int. Cl.
*G11C 11/22* (2006.01)
*H01L 49/02* (2006.01)
*H01L 27/11507* (2017.01)

(52) U.S. Cl.
CPC ............ *G11C 11/221* (2013.01); *G11C 11/22* (2013.01); *G11C 11/2273* (2013.01);
(Continued)

(58) Field of Classification Search
CPC .. G11C 11/22; G11C 11/2273; G11C 11/2275
See application file for complete search history.

(56) References Cited

U.S. PATENT DOCUMENTS 5,985,404 A * 11/1999 Yano ..................... B82Y 10/00
428/141
2002/0089005 A1* 7/2002 Wickramasinghe ... B82Y 10/00
257/295
(Continued)

OTHER PUBLICATIONS

Almahmoud, E. et al., "Dependence of Curie temperature on the thickness of an ultrathin ferroelectric film," *Physical Review B*, vol. 81 (2010): 064105.
(Continued)

*Primary Examiner* — Huan Hoang
*Assistant Examiner* — Jay Radke
(74) *Attorney, Agent, or Firm* — Cooley LLP

(57) ABSTRACT

A memory device includes a semiconductor layer with an in-plane polarization component switchable between a first direction and a second direction. A writing electrode is employed to apply a writing voltage to the semiconductor layer to change the in-plane polarization component between the first direction and the second direction. A reading electrode is employed to apply a reading voltage to the semiconductor layer to measure a tunneling current substantially perpendicular to the polarization direction of the in-plane polarization component. The directions of the reading voltage and the writing voltage are substantially perpendicular to each other. Therefore, the reading process is non-destructive. Thin films (e.g., one unit cell thick) of ferroelectric material can be used in the memory device to increase the miniaturization of the device.

22 Claims, 43 Drawing Sheets

(52) U.S. Cl.
CPC .... *G11C 11/2275* (2013.01); *H01L 27/11507* (2013.01); *H01L 28/60* (2013.01)

(56) References Cited

U.S. PATENT DOCUMENTS

| | | | | |
|---|---|---|---|---|
| 2007/0297220 | A1* | 12/2007 | Yoshikawa | B82Y 25/00 365/158 |
| 2008/0165565 | A1* | 7/2008 | Gunter | G02B 6/12007 365/145 |
| 2008/0311683 | A1* | 12/2008 | Wang | C23C 14/0641 438/3 |
| 2011/0170330 | A1 | 7/2011 | Oezyilmaz et al. | |
| 2014/0169061 | A1* | 6/2014 | Bibes | G11C 11/22 365/145 |
| 2014/0177327 | A1* | 6/2014 | Khalili Amiri | G11C 11/161 365/158 |
| 2016/0172365 | A1* | 6/2016 | McKinnon | H01L 28/40 365/145 |
| 2017/0069839 | A1* | 3/2017 | Troyan | H01L 45/1253 |

OTHER PUBLICATIONS

Bune, A. et al., "Two-dimensional ferroelectric films," *Nature*, vol. 391 (Feb. 26, 1998): 874-877.

Choi, K. et al., "Enhancement of ferroelectricity in strained BaTiO3 thin films," *Science*, vol. 306 (Nov. 5, 2004): 1005-1009.

Clarke, R. et al., "The observation of critical behaviour in the thermal expansion of PbZr0.9Ti0.1O3," *Journal of Physics C: Solid State Physics*, vol. 7 (1974): 2147.

Clarke, R., "X-ray study of the structural phase transition in Sn,,Gei ,,Te," *Physical Review B*, vol. 18 (1978): 4920-4926.

Dimmock, J. et al., "Band Structure and Laser Action in PbxSn1—xTe," *Physical Review Letters*, vol. 16 (Jun. 27, 1966): 1193.

Durr, W. et al., "Magnetic Phase Transition in Two-Dimensional Ultrathin Fe Films on Au(100)," *Physical Review Letters*, vol. 62, (1989): 206-209.

Farle, M. et al., "Ferromagnetic order and the critical exponent γ for a Gd monolayer: An electron-spin-resonance study," *Physical Review Letters*, vol. 58 (Feb. 2, 1987): 511-514.

Fong, D. et al., "Ferroelectricity in ultrathin perovskite films," *Science*, vol. 304 (2004): 1650-1653.

Fong, D. et al., "Stabilization of monodomain polarization in ultrathin PbTiO3 films," *Physical Review Letters*, vol. 96 (Mar. 31, 2006): 127601.

Garcia, V. et al., "Giant tunnel electroresistance for non-destructive readout of ferroelectric states," Nature, vol. 460 (Jul. 2, 2009): 81-84.

Ghosez, P. et al., "Microscopic model of ferroelectricity in stress-free PbTiO3 ultrathin films," *Applied Physics Letters*, vol. 76 (2000): 2767.

Giocondi, J. et al., "The Influence of the Dipolar Field Effect on the Photochemical Reactivity of Sr2Nb2O7 and BaTiO3 Microcrystals," *Topics in Catalysis*, vol. 49 (2008): 18.

Gozar, A. et al., "High-temperature interface superconductivity between metallic and insulating copper oxides," *Nature*, vol. 455 (2008): 782.

Hsieh, T. et al., "Topological Crystalline Insulators in the SnTe Material Class," *Nature Communications*, vol. 3 (2012): 982.

Iizumi, M. et al., "Phase Transition in SnTe with Low Carrier Concentration," *Journal of the Physical Society of Japan*, vol. 38 (1975): 443-449.

Junquera, J. et al., "Critical thickness for ferroelectricity in perovskite ultrathin films," *Nature*, vol. 422 (Apr. 3, 2003): 506-509.

Kobayashi, K. et al., "Carrier-Concentration-Dependent Phase Transition in SnTe," *Physical Review Letters*, vol. 37 (Sep. 20, 1976): 772.

Novoselov, K. et al., "Two-dimensional gas of massless Dirac fermions in graphene," *Nature*, vol. 438, (Nov. 10, 2005): 197-200.

Sai N. et al., "Ferroelectricity in ultrathin perovskite films," *Physical Review B*, vol. 72 (2005): 020101.

Sai, N. et al., "Absence of Critical Thickness in an Ultrathin Improper Ferroelectric Film," *Physical Review Letters*, vol. 102 (2008): 107601.

Samara, G. et al., "Important Generalization Concerning the Role of Competing Forces in Displacive Phase Transitions," *Physical Review Letters*, vol. 35 (Dec. 29, 1975): 1767.

Sheng, A. et al., "Multiple stable states with in-plane anisotropy in ultrathin $YMnO_3$ films," *Advanced Materials*, vol. 22 (Dec. 21, 2010): 5507.

Sugai, S. et al., "Observation of soft TO-phonon in SnTe by Raman scattering," *Solid State Communications*, vol. 23 (Jul. 1977): 127.

Tenne, D. et al., "Ferroelectricity in ultrathin BaTiO3 films: probing the size effect by ultraviolet Raman spectroscopy," Physical Review Letters, vol. 103 (2009): 177601.

Tybell, T. et al., "Ferroelectricity in thin perovskite films," *Applied Physics Letters*, vol. 75 (Aug. 1999): 856.

Ugeda, M. et al., "Characterization of collective ground states in single-layer $NbSe_2$," *Nature Physics*, vol. 12 (Nov. 2, 2015): 92-97 arXiv preprint arXiv:1506.08460.

Wang, N. et al., "Microscopic origin of the p-type conductivity of the topological crystalline insulator SnTe and the effect of Pb alloying," *Physical Review B*, vol. 89 (2014): 045142.

Wu, Z. et al., "Ferroelectricity in Pb(Zr0.5Ti0.5)O3 thin films: Critical thickness and 180° stripe domains," *Physical Review B*, vol. 70 (2004): 104108.

Xi, X. et al., "Strongly enhanced charge-density-wave order in monolayer $NbSe_2$," *Nature Nanotechnology*, vol. 10 (Jul. 20, 2015): 765-769.

Zhang, T. et al., "Superconductivity in one-atomic-layer metal films grown on Si(111)," *Nature Physics*, vol. 6 (2010): 104.

Zhang, Y. et al., "Experimental observation of the quantum Hall effect and Berry's phase in graphene," *Nature*, vol. 438 (2005): 201.

Zhang, Y. et al., "Disappearance of ferroelectric critical thickness in epitaxial ultrathin BaZrO3 films," *Physical Review B*, vol. 90 (2014): 184107.

Chang, K. et al., "Discovery of robust in-plane ferroelectricity in atomic-thick SnTe," *Science*, vol. 353, Issue 6296 (Jul. 15, 2016), pp. 274-278.

International Search Report and Written Opinion dated Oct. 5, 2017 from International Application No. PCT/US17/21330, 10 pages.

\* cited by examiner

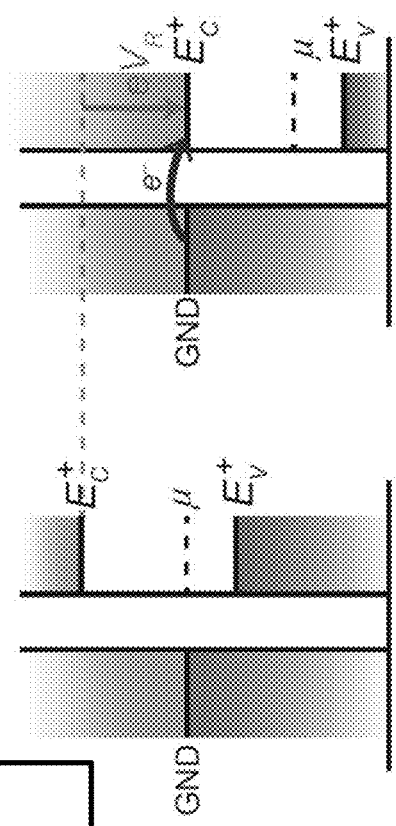
FIG. 2A / FIG. 2B
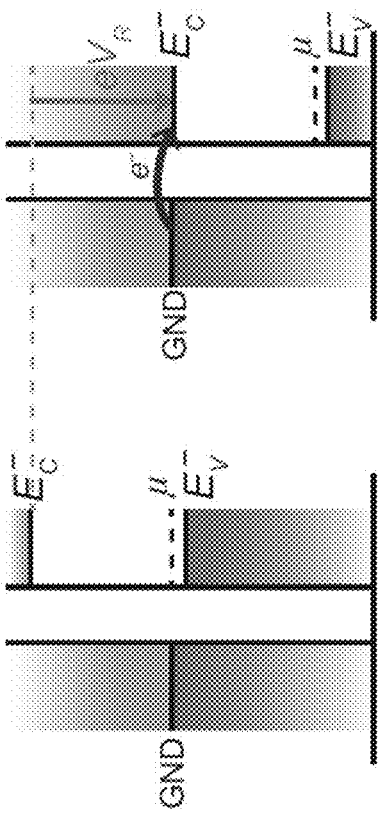
FIG. 2C / FIG. 2D

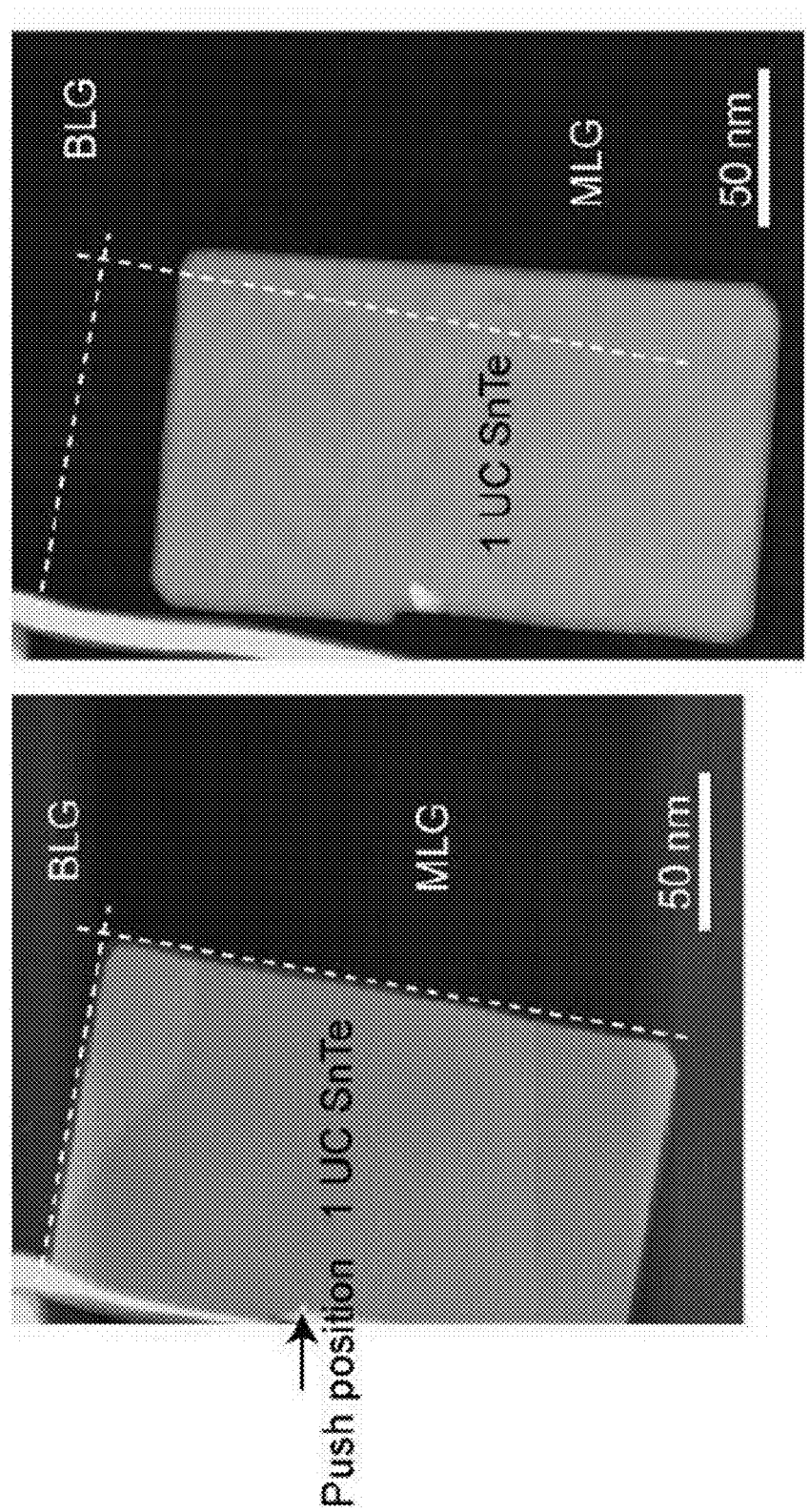

domain wall

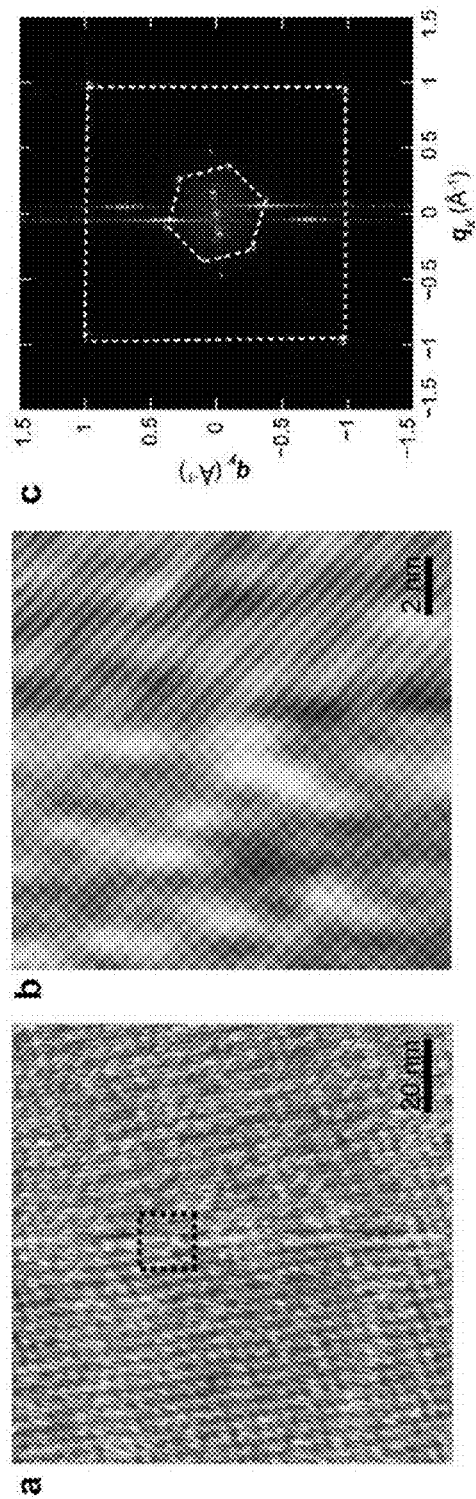

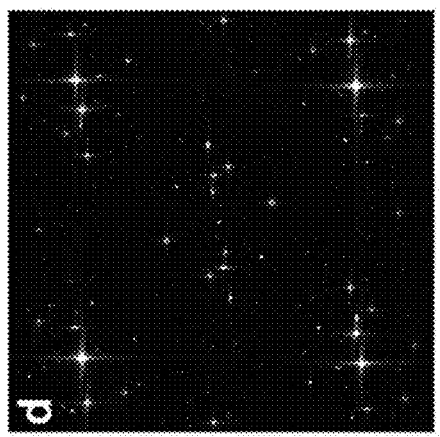
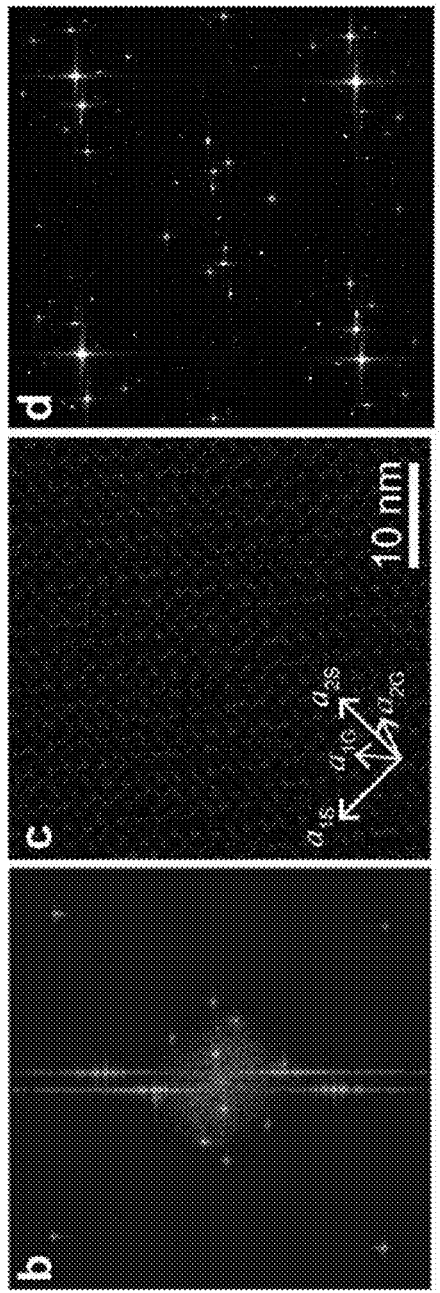
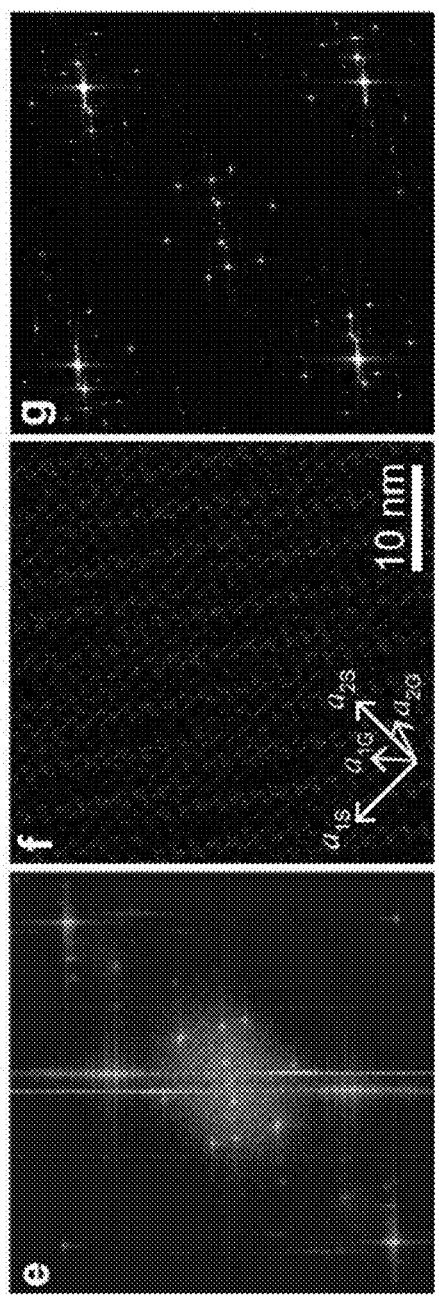
FIG. 20A  FIG. 20B  FIG. 20C
FIG. 20D  FIG. 20E  FIG. 20F

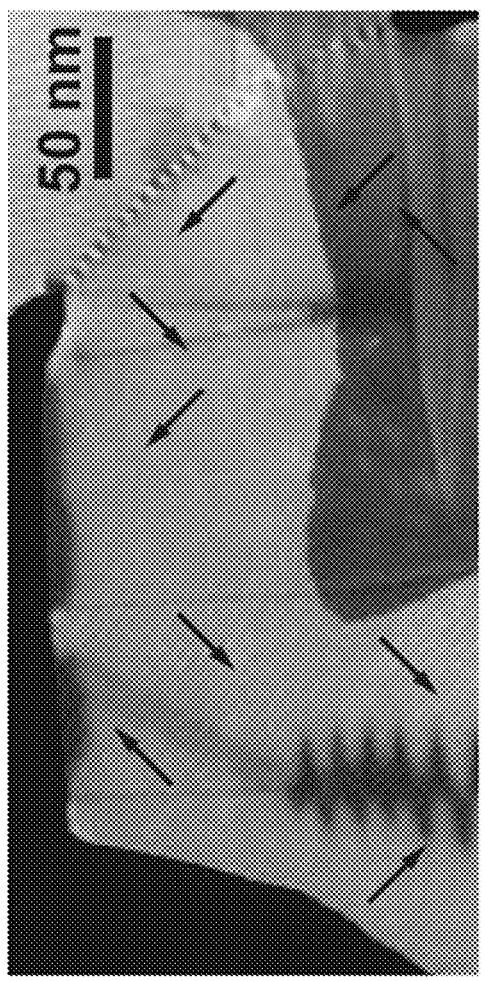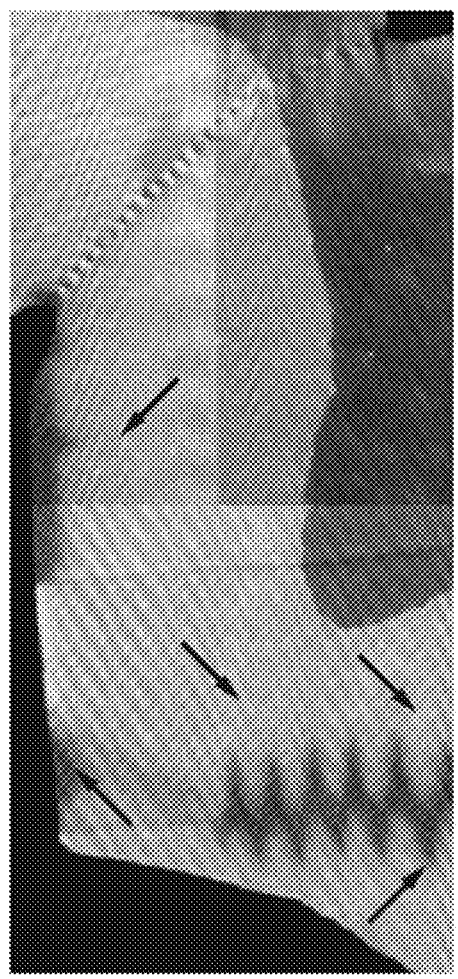
FIG. 29A
FIG. 29B

APPARATUS AND METHODS FOR MEMORY USING IN-PLANE POLARIZATION

CROSS-REFERENCES TO RELATED APPLICATIONS

This application claims priority to U.S. Application No. 62/304,986, filed Mar. 8, 2016, entitled "RANDOM ACCESS MEMORY BASED ON IN-PLANE FERRO-ELECTRICITY," which is hereby incorporated herein by reference in its entirety.

GOVERNMENT SUPPORT

This invention was made with Government support under Grant No. DE-SC0010526 awarded by the Department of Energy. The Government has certain rights in the invention.

BACKGROUND

Ferroelectricity is the property of certain materials (also referred to as ferroelectric materials) that have a spontaneous electric polarization controllable by the application of an external electric field. For example, the direction of the polarization of a ferroelectric material can be changed by the direction of the external field. In other words, applying an electric field along one direction can align the polarization direction of the ferroelectric material along that direction, and applying another electric field in the opposite direction can reverse the polarization direction of the ferroelectric material.

Ferroelectricity can be used in constructing memory devices, in which the polarization state of the ferroelectric material can represent information. For instance, one polarization may represent a "0" bit and another polarization state can represent a "1" bit. Conventional memory devices using a ferroelectric material usually use out-of-plane polarization states in which the polarization is perpendicular to the surface of the ferroelectric material. In these devices, writing voltages are applied across the thickness of the ferroelectric material (i.e., perpendicular to the surface of the ferroelectric material) to change the polarization. The reading voltage is also perpendicular to the surface of the ferroelectric material to measure the polarization state of the ferroelectric material. The information written into the memory can be read out by detecting the polarization state of the ferroelectric material. This can be realized by applying a reading voltage that is also perpendicular to the surface of the ferroelectric material and then measuring the pulse current across the ferroelectric material in response to the reading voltage to determine the polarization state.

Conventional memory devices using out-of-plane polarization of ferroelectric materials have several drawbacks. First, both the writing voltage and the reading voltage are applied across the thickness of the ferroelectric material. Therefore, the reading voltage (and the reading process) can change the polarization state of the ferroelectric material. Accordingly, the reading process in these devices is destructive and a reset electric field is usually applied to maintain the initial polarization. This can increase the complexity and power consumption of the memory devices. Second, since out-of-plane polarization is used, the ferroelectric material usually has a thickness greater than a threshold thickness (e.g., at least several unit cells of the ferroelectric material) in order to build up the polarization field. This limits the smallest possible size of a memory device that uses out-of-plane polarization.

SUMMARY

Embodiments of the present technology generally relate to memory devices using in-plane polarization in ferroelectric materials. In one example, an apparatus includes a semiconductor layer having an in-plane polarization component switchable between a first direction and a second direction opposite to the first direction. The apparatus also has at least one writing electrode, in electrical communication with the semiconductor layer, to apply a writing voltage to the semiconductor layer. The writing voltage switches the in-plane polarization component between the first direction and the second direction. The apparatus also includes at least one reading electrode, in electrical communication with the semiconductor layer, to apply a reading voltage to the semiconductor layer. The reading voltage measures a tunneling current substantially perpendicular to the polarization direction of the in-plane polarization component.

In another example, a method includes applying a first writing voltage to a semiconductor layer having an in-plane polarization component. The first writing voltage causes the in-plane polarization component to switch between a first direction and a second direction. The method also includes applying a reading voltage on the semiconductor layer to measure a tunneling current substantially perpendicular to the polarization direction of the in-plane polarization component.

In yet another example, a random access memory device includes a ferroelectric semiconductor layer having an in-plane polarization component switchable between a first direction and a second direction opposite to the first direction. The ferroelectric semiconductor layer has a thickness substantially equal to or less than 10 nm and a length of about 10 nm to about 50 nm. The memory device also includes an insulator layer disposed on a first surface of the ferroelectric semiconductor layer. The memory device also includes a writing electrode, disposed on a first side of the insulator layer, to apply a writing voltage to the ferroelectric semiconductor layer. The writing voltage switches the in-plane polarization component between the first direction and the second direction. A ground electrode is disposed on a second side, opposite the first side, of the insulator layer. A graphene layer is disposed on a second surface, opposite the first surface, of the ferroelectric semiconductor layer, to apply a reading voltage, with respect to the ground electrode, to the ferroelectric semiconductor layer to measure a tunneling current substantially perpendicular to the first surface of the ferroelectric semiconductor layer.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 2A-2D show band diagrams that illustrate the tunneling process within the thin layer of ferroelectric material in the memory device shown in FIG. 1.

FIGS. 8A and 8B show STM topography images of a single unit cell (UC) SnTe island before and after displacement by a STM tip, respectively.

FIG. 19A shows the original STM image in FIG. 18 with the boundary region labelled in a dashed rectangular box.

FIG. 19B shows a close-up of the boundary region in FIG. 19A.

FIG. 19C shows the Fourier transform of the STM image in FIG. 19A.

FIGS. 20A-20F show simulation results of the Moiré patterns observed in FIG. 18.

FIGS. 29A and 29B show STM topography images of a one UC SnTe film before and after a voltage pulse is applied, respectively.

DETAILED DESCRIPTION

Memory Devices Using In-Plane Ferroelectricity

To address the drawbacks in conventional ferroelectric memories, apparatus and methods described herein employ in-plane polarization of ferroelectric materials. In contrast to out-of-plane polarization, where the polarization is perpendicular to the surface of a ferroelectric material, with in-plane polarization the polarization is parallel to the surface of the ferroelectric material. Accordingly, in a memory device using in-plane polarization, the writing voltage is applied in parallel to the surface of the ferroelectric material to change the polarization direction. The reading voltage is perpendicular to the surface of the ferroelectric material. Therefore, the reading voltage does not change the in-plane polarization of the ferroelectric material and accordingly the reading process is non-destructive. In addition, the in-plane polarization can be generated in very thin films, such as a film having a thickness of only one unit cell (UC). Therefore, the resulting memory can be very compact and consume very small amounts of power.

Figure 1:
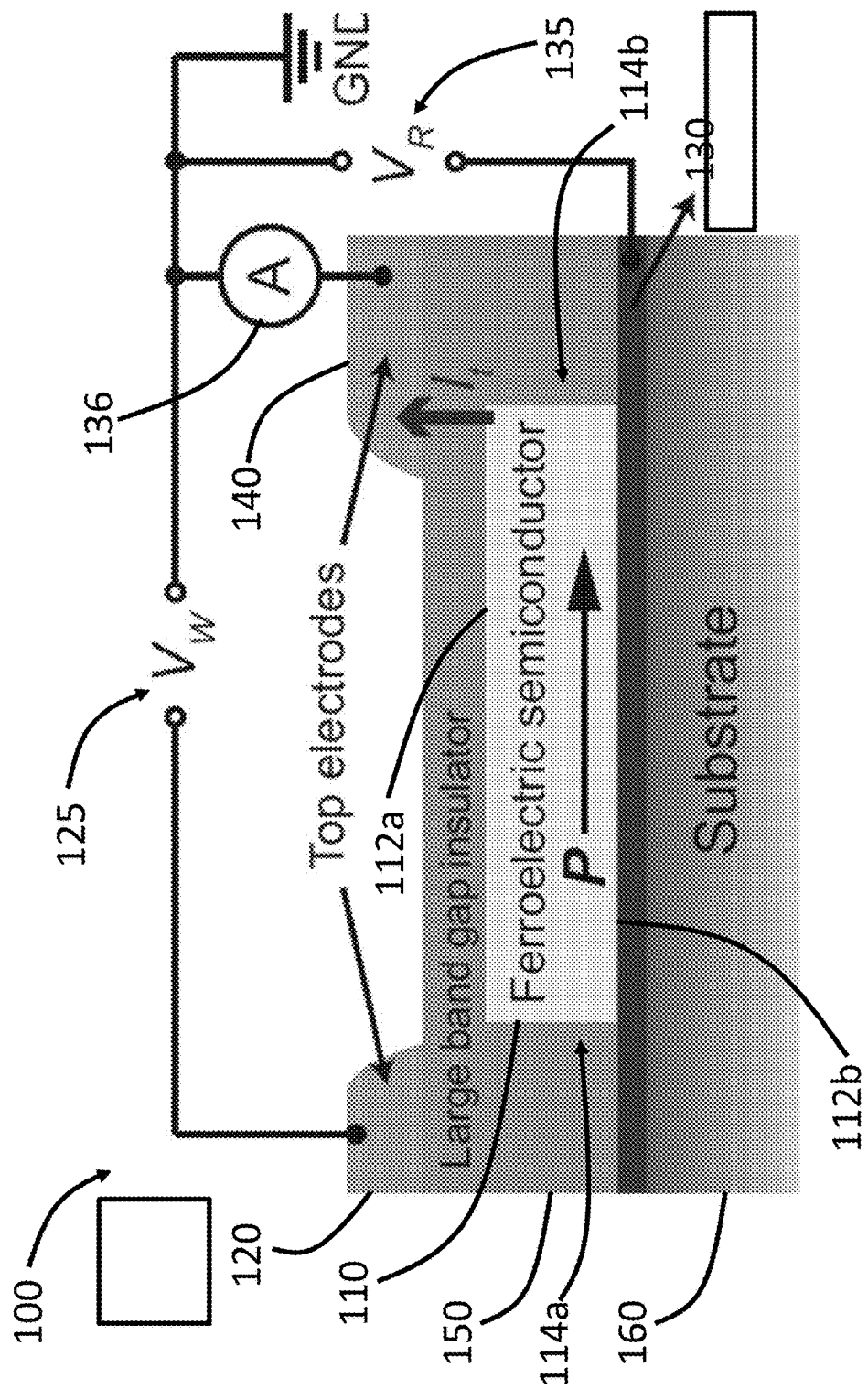
FIG. 1 shows a schematic of a memory device using in-plane polarization of a thin layer of ferroelectric material.

FIG. 1 shows a schematic of a memory device 100 that uses in-plane ferroelectricity. The device 100 includes a semiconductor layer 110, which has a ferroelectric polarization component switchable between a first direction and a second direction. The semiconductor layer 110 has a first surface 112a and a second surface 112b. A writing electrode 120 is disposed in electrical communication with the semiconductor layer 110 and a writing voltage source 125 to apply a writing voltage on the semiconductor layer 110. A reading electrode 130 is disposed in electrical communication with the semiconductor layer 110 and a reading voltage source 135 to detect the polarization direction of the semiconductor layer 110 by measuring the tunneling current $I_t$, which is substantially perpendicular to the semiconductor layer 110. The tunneling current $I_t$ can be recorded by a current detector 136. The memory device 100 also includes an optional insulator layer 150 surrounding the semiconductor layer 110. An optional substrate 160 can be used to support the semiconductor layer 110. The substrate 160 can also be used to epitaxially grow the semiconductor layer 110 (see more details below).

In the device 100, the writing voltage is applied with reference to a ground electrode 140. The writing electrode 120 is disposed on a first side 114a of the semiconductor layer 110 and the ground electrode 140 is disposed on a second side 114b (i.e., opposite side) of the semiconductor layer 110. The direction of the writing voltage (and the electric field generated by the writing voltage) is substantially parallel to the surface of the semiconductor layer 110. The direction of the in-plane polarization component is usually aligned with the direction of the writing voltage. Therefore, changing the sign of the writing voltage can change the direction of the in-plane polarization component, thereby enabling writing different information ("1" or "0") into the memory device 100. For example, a positive writing voltage can be applied to write a "1" bit into the memory device 100 and a negative writing voltage can be applied to write a "0" bit into the memory device 100.

The reading electrode 130 disposed on the second surface 112b also applies the reading voltage with reference to the ground electrode 140 that is disposed above the first surface 112a. In this case, the writing electrode 120 and the reading electrode 130 share the same ground electrode 140. In other words, the ground electrode 140 facilitate applications of both the reading voltage and the writing voltage.

Alternative configurations of electrodes can also be used. In general, the device 100 can include two electrodes (e.g. writing electrode and ground electrode) to produce the electric fields parallel to the surface of semiconductor layer 110 to alter the polarization direction (i.e., to write information) and two electrodes (e.g. reading electrode and ground electrode) to place a small voltage between the two surfaces 112a and 112b of semiconductor layer 110 around the edge to measure the tunneling current (i.e., to read the information). The two pair of electrodes can also share one electrode (e.g., the ground electrode 140).

For example, the writing electrode 120 and the reading electrode 130 can have separate ground electrodes. In another example, the reading electrode 130 can be set as the ground electrode. During writing, the electrode 120 can be used to apply a first writing voltage with reference to the electrode 130 to cause the in-plane polarization component to align with one direction, and the electrode 140 can be used to apply a second writing voltage with reference to the electrode 130 to cause the in-plane polarization component to align with another direction. During the reading process, the electrode 140 can be used to apply the reading voltage. In yet another example, two electrodes (e.g., the writing electrode 120 and the ground electrode 140) can be disposed on the second surface 112b, while the reading electrode 130 is disposed above the first surface 112a.

Without being bound by any particular theory or mode of operation, the in-plane polarization of the semiconductor layer 110 causes electrical charges (e.g., electrons and holes) to accumulate on the edges of the semiconductor layer 110. For example, when the in-plane polarization is from left to right (as shown in FIG. 1), negative charge (electrons) can accumulate on the right edge, where the reading electrode 130 and the ground electrode 140 are disposed. These electrons can tunnel through the semiconductor layer 110 and the insulator layer 150, forming the tunneling current $I_t$. The sign and magnitude of the tunneling current $I_t$ depends on the sign of the electrical charges accumulated on the right edge of the semiconductor layer 110 and therefore depends on the direction of the in-plane polarization component of the semiconductor layer 110. Accordingly, the measured tunneling current $I_t$ can indicate the direction of the in-plane polarization component and the information stored in the memory device (i.e., "1" or "0").

FIGS. 2A-2D show band diagrams of the semiconductor layer 110 that illustrate the tunneling process between the semiconductor layer 110 and the ground electrode 140 in the device 100. FIGS. 2A and 2B show the band diagrams under positive polarization without the reading voltage and with the reading voltage, respectively. FIGS. 2C and 2D show the band diagrams under negative polarization without the reading voltage and with the reading voltage, respectively. In the band diagrams, $\mu$ is the chemical potential. $E^+_c$ and $E^-_c$ are the potential of the conductive band under positive polarization and negative polarization, respectively. And $E^+_v$ and $E^-_v$ are the potential of the valence band under positive polarization and negative polarization, respectively.

For the positively charged state shown in FIG. 2B, a threshold voltage $V_R = E^+_c/e$ ($E^-_c/e$) can be used to open the tunneling channel between the ground electrode 140 and the conduction band of the edge of the semiconductor layer 110. For the negatively charged state, a threshold voltage $V_R = E^-_c/e$ can be used to open the tunneling channel between the ground electrode 140 and the conduction band of the edge of the semiconductor layer 110.

The semiconductor layer 110 can use any material that has an in-plane polarization component switchable by an external electric field. For example, the semiconductor layer 110 can include ferroelectric materials such as a IV-VI semiconductor XY, where X=Ge, Sn, or Pb, Y=S, Se, or Te. In another example, alloys, such as $Pb_xSn_{1-x}Se$, $Pb_xSn_{1-x}S$, $Pb_xSn_{1-x}Te$, $Pb_xSn_yGe_{1-x-y}S$, $Pb_xSn_yGe_{1-x-y}Se$, and $Pb_xSn_yGe_{1-x-y}Te$, can also be used. In yet another example, super-lattices, such as PbTe/SnTe, PbSe/SnSe, PbSe/SnTe, can also be used. Other materials that can be used for the semiconductor layer 110 include perovskite type of ferroelectric materials (e.g., BaTiO3, PbTiO3, $Pb[Zr_xTi_{1-x}]O_3$ (PZT), and their alloy and superlattice), $KH_2PO_4$, organic ferroelectric materials (e.g., Thiourea, TEMPO, Benzil, and PVDF), and organic-inorganic ferroelectric materials, such as $HdabcoReO_4$ and Rochelle salt, among other.

The thickness of the semiconductor layer 110 can be about 0.5 nm to about 5 nm (e.g., about 0.5 nm, about 1 nm, about 1.5 nm, about 2 nm, about 2.5 nm, about 3 nm, about 3.5 nm, about 4 nm, about 4.5 nm, or about 5 nm, including any values and sub ranges in between). The thickness of the semiconductor layer 110 can also be defined in terms of the number of unit cells (UCs) across the semiconductor layer 110 (e.g., 1 UC of SnTe is about 0.63 nm). For example, the thickness of the semiconductor layer 110 can include about 1 UC to about 10 UCs (e.g., about 1 UC, about 2 UCs, about 3 UCs, about 4 UCs, about 5 UCs, about 6 UCs, about 7 UCs, about 8 UCs, about 9 UCs, or about 10 UCs).

The length of the semiconductor layer 110 can be about 10 nm to about 50 nm (e.g., about 10 nm, about 15 nm, about 20 nm, about 25 nm, about 30 nm, about 35 nm, about 40 nm, about 45 nm, or about 50 nm, including any values and sub ranges in between). In some cases, the length of the semiconductor layer 110 can be greater than 50 nm (e.g., greater than 50 nm, greater than 100 nm, greater than 200 nm, greater than 500 nm, greater than 1 μm, greater than 2 μm, greater than 5 μm, greater than 10 μm, greater than 20 μm, or greater than 50 μm).

The length of the semiconductor layer 110 can be substantially equal to the distance between the writing electrode 120 and the ground electrode 140 to facilitate the application of the writing voltage along the plane of the semiconductor layer 110. The length of the semiconductor layer 110 can also be defined in terms of the number of UCs. For example, the length can be longer than 5 UCs (e.g., longer than 5 UCs, longer than 10 UCs, longer than 15 UCs, longer than 20 UCs, or longer than 25 UCs, including any values and sub ranges in between).

The semiconductor layer 110 can also have various shapes. For example, the semiconductor layer 110 can be rectangular, square, round, elliptical, or any other appropriate shape.

In the above description, the in-plane polarization component is switchable between two opposite directions. Alternative configurations can also be used. Generally, the in-plane polarization component can bet switchable between any two different directions to store different information. In addition, more than two directions can also be used. For example, the semiconductor layer 110 can define an x-y plane. Two writing electrodes can be disposed along the x-axis to cause the in-plane polarization component to align with +x and −x directions. Two more writing electrodes can be disposed along the y-axis to cause the in-plane polarization component to align with +y and −y directions.

The electrodes in the memory device 100, including the writing electrode 120, the reading electrode 130, and the ground electrode 140, can use any conductive material. For example, the electrodes can include a metal material, such as gold, silver, copper, or aluminum, among others. In another example, the electrodes can include a conductive polymer, a conductive oxide, a carbon nanotube (CNT) layer, a graphene layer, or a nanowire mesh, among others.

In the memory device 100, graphene can be used to form the reading electrode 130. In addition to applying the reading voltage with reference to the ground electrode 140, a graphene reading electrode 130 can also serve as a substrate to epitaxially grow the semiconductor layer 110. This approach can reduce the strain effect of the substrate 160 on the semiconductor layer 110, thereby reducing the dislocation density in the semiconductor layer 110. In this case, the reading electrode 130 can cover substantially all the bottom surface of the semiconductor layer 110 (as shown in FIG. 1).

The reading electrode 130 can also be much smaller than the size of the semiconductor layer 110. For example, the reading electrode 130 can be substantially similar in size to the ground electrode 140 or the writing electrode. In this case, the reading electrode 130 can be disposed in proximity to the edge of the semiconductor layer 110 to increase the signal magnitude of the tunneling current $I_t$.

The lateral size of the reading electrode 130 can depend on at least two factors. On the one hand, a larger reading electrode 130 can collect more tunneling current $I_t$, thereby increasing the signal strength. On the other hand, the difference between the tunneling currents $I_{t1}$ and $I_{t2}$ under positive and negative polarization, respectively, usually has a maximal value at the edge of the semiconductor layer 110. Therefore, a smaller reading electrode 130 can lead to a higher ON/OFF ratio, which can be proportional to the ratio $|I_{t1}/I_{t2}|$, in the resulting memory device 100. In practice, the ratio of the reading electrode length to the length of the semiconductor layer 110 can be about 1/20 to about 1/2 (e.g., about 1/20, about 1/15, about 1/10, about 1/5, or about 1/2, including any values and sub ranges in between).

A larger ON/OFF ratio in the memory device 100 can allow easier read-out of the information stored in the memory device 100 (e.g., using a lower reading voltage, or having a higher signal to noise ratio). The ON/OFF ratio of the memory device 100 depends on several factors, including the material of the semiconductor layer 110, the in-plane polarization strength, the thickness of semiconductor layer 110, the properties and size of the reading electrodes, the thickness and gap of insulator layer 150, and the magnitude of the reading voltage. In practice, the ON/OFF ratio can be greater than 100 (e.g., greater than 100, greater than 200, greater than 500, greater than 1000, greater than 2000, or greater than 3000, including any values and sub ranges in between). The high ON/OFF ratio can also reduce the power consumption in the reading/writing processes.

The insulator layer 150 in the memory device 100 can be employed to reduce the probability of electric discharge between the reading electrodes 130 and the ground electrode 140. The bandgap of the insulator layer 150 can be greater than 2 eV (e.g., greater than 2 eV, greater than 5 eV, greater than 10 eV, greater than 15 eV, or greater than 20 eV, including any values and sub ranges in between).

Methods of Writing and Reading Information Using In-Plane Ferroelectricity

Figure 3:
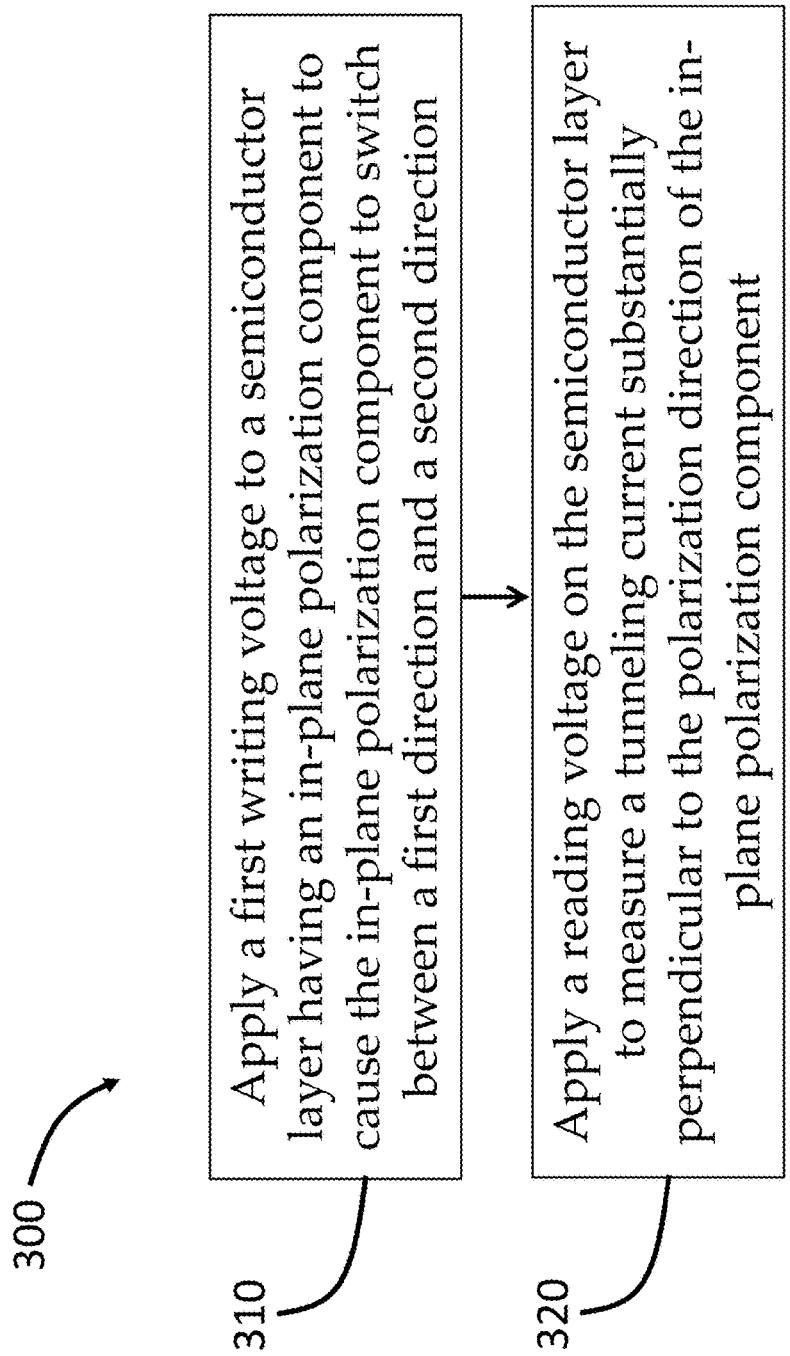
FIG. 3 illustrates a method of reading and writing data using in-plane ferroelectricity.

FIG. 3 illustrates a method 300 of writing and reading information using in-plane ferroelectricity in a semiconductor layer. The in-plane polarization component of the semiconductor layer can be controlled by a writing voltage applied on the semiconductor layer. The method 300 includes, at step 310, applying a first writing voltage to the semiconductor layer to cause the in-plane polarization component to switch between a first direction and a second direction. When in the first direction, the semiconductor layer can store one bit of information, such as a "1." And when in the second direction, the semiconductor layer can store another bit of information, such as a "0." In this manner, the writing process is achieved by applying different writing voltages (e.g., having different signs). The method 300 also includes, at step 320, applying a reading voltage on the semiconductor layer to measure a tunneling current substantially perpendicular to the polarization direction of the in-plane polarization component. The sign and magnitude of the tunneling current indicates the direction of the in-plane polarization component and accordingly the information stored in the semiconductor layer.

The writing voltage can be applied via two writing electrodes disposed on opposite sides of the semiconductor layer. This configuration can allow the electric field induced by the writing voltage to be substantially parallel to the semiconductor layer, thereby facilitating the alignment of the in-plane polarization component along one direction or the other. The distance between the two writing electrodes can be substantially equal to the length of the semiconductor layer. For example, the distance can be about 10 nm to about 50 nm.

The reading voltage can be applied via two reading electrodes disposed on opposite surfaces at the edge of the semiconductor layer. (In some cases, one of the reading electrodes and one of the writing electrodes may be the same common ground electrode as explained below.) Since electric charge tends to accumulate at the edge of the semiconductor layer under polarization, disposing the reading electrodes at the edge can increase the ON/OFF ratio of the measurement, as well as the strength of the measured signal.

The measured tunneling current also depends on the thickness of the semiconductor layer and the magnitude of the reading voltages. In practice, the thickness of the semiconductor layer can be about 0.5 nm to about 5 nm. The reading voltage can determine the strength of the polarization and therefore the magnitude of the tunneling current. In the method 300, the reading voltage can be configured to achieve an ON/OFF ratio greater than 100 (e.g., greater than 100, greater than 200, greater than 500, greater than 1000, or greater than 2000, including any values and sub ranges in between).

A graphene layer can be used to function as both the reading electrode and as a substrate layer to epitaxially grow the semiconductor layer. In this case, the graphene layer can be disposed on a base substrate and the semiconductor layer is then grown on the graphene layer, which can reduce the dislocation density in the semiconductor layer.

As described above, the reading process in memory devices using in-plane polarization is non-destructive. In addition, the storage of data in these memory devices is also non-volatile. Therefore, the method 300 can include multiple reading steps 320 without maintaining the writing voltage on the semiconductor layer and without applying the writing voltage again to reset the information. For example, the method 300 can include removing the first writing voltage after step 310 (or after measuring the tunneling current at step 320). Then multiple reading steps can be performed to read the data without applying any writing voltage to reset the data.

The reading the writing processes in the method 300 can be performed at a temperature substantially equal to or greater than 150 K. In some cases, the method 300 can be carried out at room temperature (e.g., about 300 K or above).

Memory Devices Using SnTe

Figures 4A, 4B:
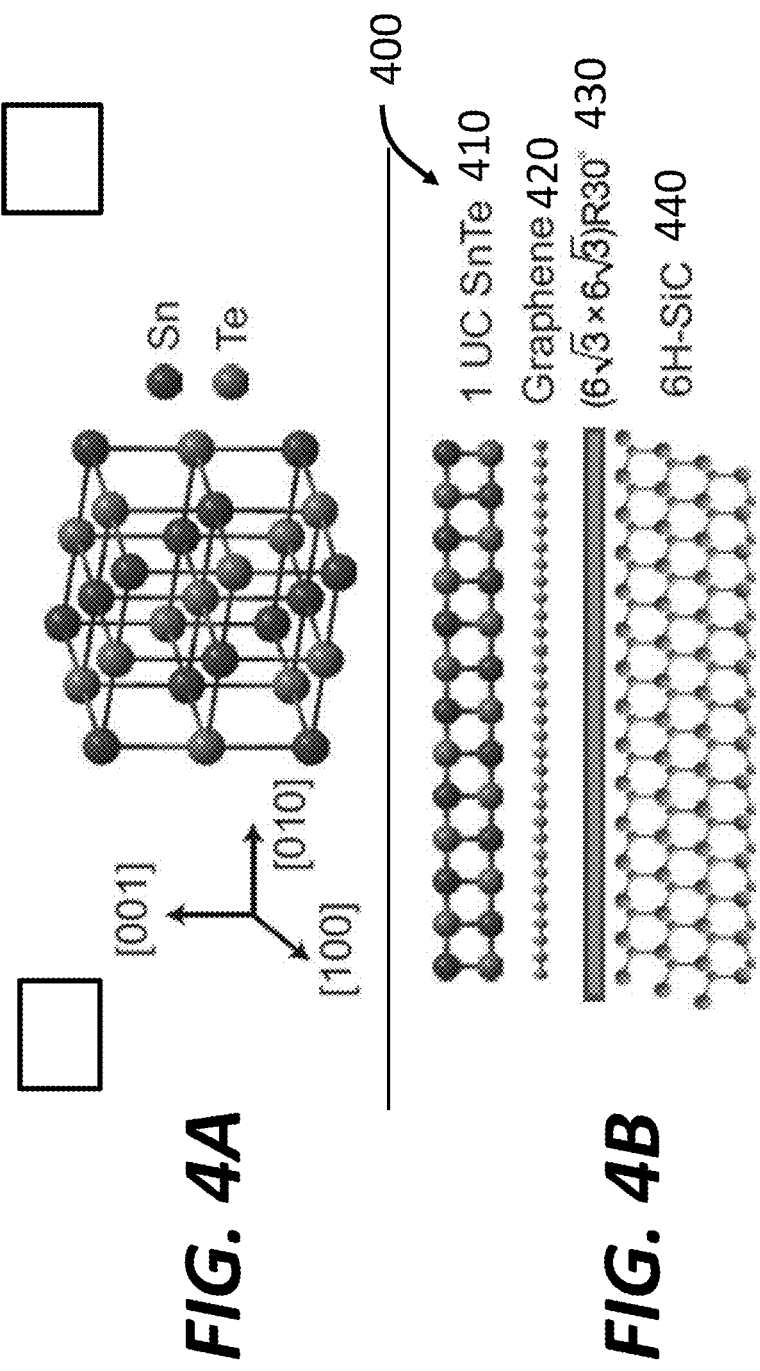
FIG. 4A shows the lattice structure of bulk SnTe.
FIG. 4B shows the lattice structure of thin film SnTe epitaxially grown on a graphene layer disposed on a SiC substrate.

As described above, one material that can be used in the semiconductor layer 110 in the device 100 shown in FIG. 1 is tin telluride (SnTe). FIG. 4A shows the lattice structure of bulk SnTe. In bulk form, SnTe is a narrow-gap (e.g., about 0.2 eV) semiconductor and possesses rock salt structure with a lattice constant of about 6.32 Å at room temperature. SnTe is typically heavily p-type doped because of the negative formation energy of the Sn vacancy. At the ferroelectric transition temperature $T_c$, the crystal can undergo a cubic-to-rhombohedral structural phase transition, and the two sub-lattices of Sn and Te atoms are displaced from each other along the [111] direction. This displacement can form the ferroelectric state. Due to the screening effect of charge carriers, the transition temperature $T_c$ can drop rapidly as the concentration of Sn vacancy increases. Generally, the highest transition temperature of bulk SnTe is about 98 K. In contrast, the transition temperature in thin film SnTe can be much higher (e.g., room temperature). Therefore, memory devices can use thin film SnTe, instead of bulk SnTe, as the storage medium.

Fabrication of SnTe Films

Fabrication of SnTe films with precise control of the film thickness on the atomic scale can be fabricated using the molecular beam epitaxial (MBE) technique. In this technique, a graphitized 6H—SiC(0001) substrate can be used to avoid external strain effects on the SnTe film. The weak Van der Waals bonding between the substrate and SnTe film can reduce the strain effect and helps to preserve the in-plane component. A graphene layer can be disposed on the substrate to reduce dislocation on the SnTe film at least because of the small lattice mismatch between SnTe and graphene. In one example, the graphene can be monolayer graphene. In another example, the graphene can be bilayer graphene or multilayer graphene.

To prepare the graphitized substrate, a SiC substrate can be annealed under Si flux at a high temperature (e.g., about 850° C. to about 950° C.). The annealing can take, for example, about 10 min or longer to form a Si-rich surface with (3×3) reconstruction. The annealed SiC substrate can then be heated up to 1400° C. for 10 min to graphitize the surface. Then the surface of the graphitized substrate can be covered with graphene.

The growth and characterization of the SnTe samples can be performed on a Unisoku system (Unisoku Co. Ltd, Japan) combining low-temperature scanning tunneling microscope (STM) and molecular beam epitaxy. The base pressure of the system can be about $1 \times 10^{-10}$ Torr. Under this base pressure, SnTe molecules can be evaporated from a boron nitride (BN) crucible. The temperature of source can be set at about 450° C., giving rise to a slow growth rate of about 2.5 unit cell (UC) per hour. The substrate temperature can vary from room temperature (e.g., about 25° C.) to about 200° C. In general, a higher temperature can reduce the probability of fractal growth. Fractal grown can form terraces and islands with irregular edges that can reduce the thickness uniformity of the resulting film.

FIG. 4B shows a schematic of fabrication system 400 including a thin film SnTe 410 epitaxially grown on a graphene layer 420, which is disposed on a SiC substrate 440. FIG. 4B also shows characterization 430 of reconstruction of the surface of 6H—SiC. The thin film 410 has a thickness of one unit cell (UC) and includes two single-atom layers of alternating Sn atoms and Te atoms. The thickness of the SnTe film 410 is about 0.63 nm.

Characterizations of SnTe Films

SnTe films fabricated using the methods described above can be characterized by the in situ reflective high energy electron diffraction (RHEED) and scanning tunneling microscopy (STM) topography images.

Figure 5A:
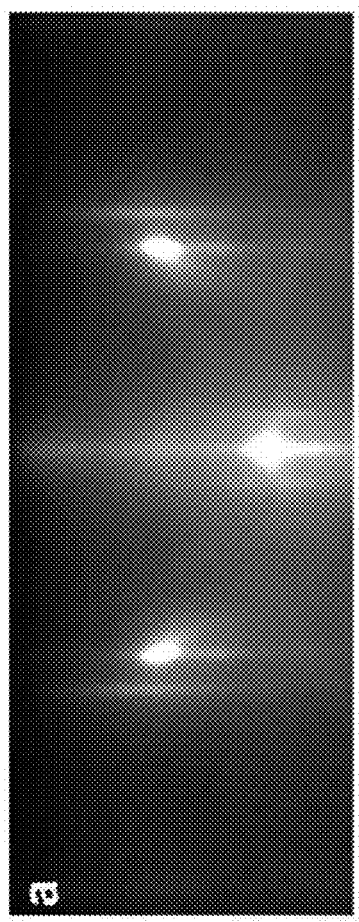
FIGS. 5A and 5B show in situ reflective high energy electron diffraction (RHEED) patterns of a SiC substrate and a SnTe film epitaxially grown on the SiC substrate, respectively.
Figure 5B:
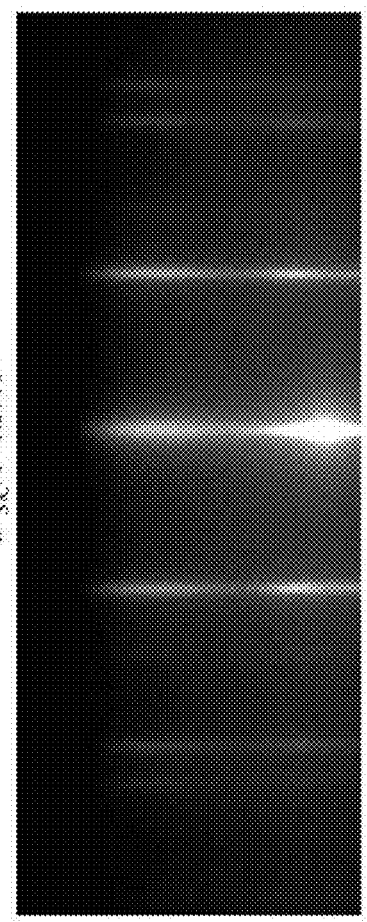

FIGS. 5A and 5B show RHEED patterns of a SiC substrate and an as-grown SnTe film, respectively. RHEED patterns are usually employed to investigate the surface properties of crystalline materials. The average thickness of the SnTe islands is more than 10 UCs when no stripe from the substrate appears any more. The SnTe stripes on the RHEED pattern can be seen from any incidental azimuth angle, indicating that the in-plane orientations of the SnTe islands are random.

Figure 6:
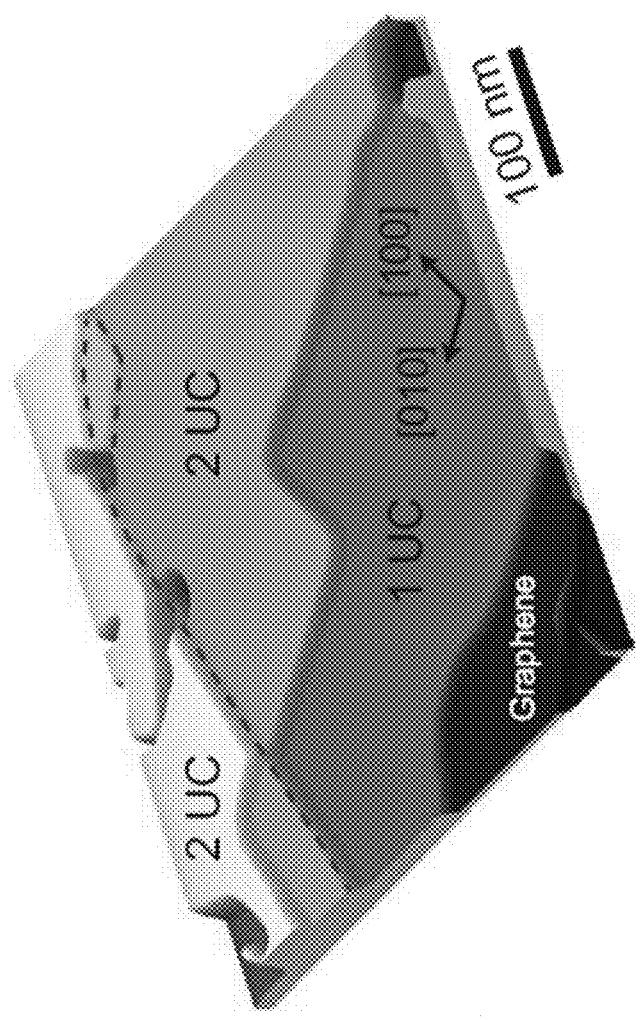
FIG. 6 shows a scanning tunneling microscope (STM) topography image of a thin SnTe film epitaxially grown on a SiC substrate.

FIG. 6 shows a scanning tunneling microscope (STM) topography image of a thin SnTe film (e.g., film 410) fabricated using the methods described above. The image was acquired at a sample bias voltage of 3.0 V, a tunneling current of about 30 pA, and a temperature of about 4.7 K. The dotted line towards the top of FIG. 6 indicates the substrate steps. The STM image shows that one section of the SnTe film has a thickness of one UC and another section has a thickness of two UCs.

Figure 7:
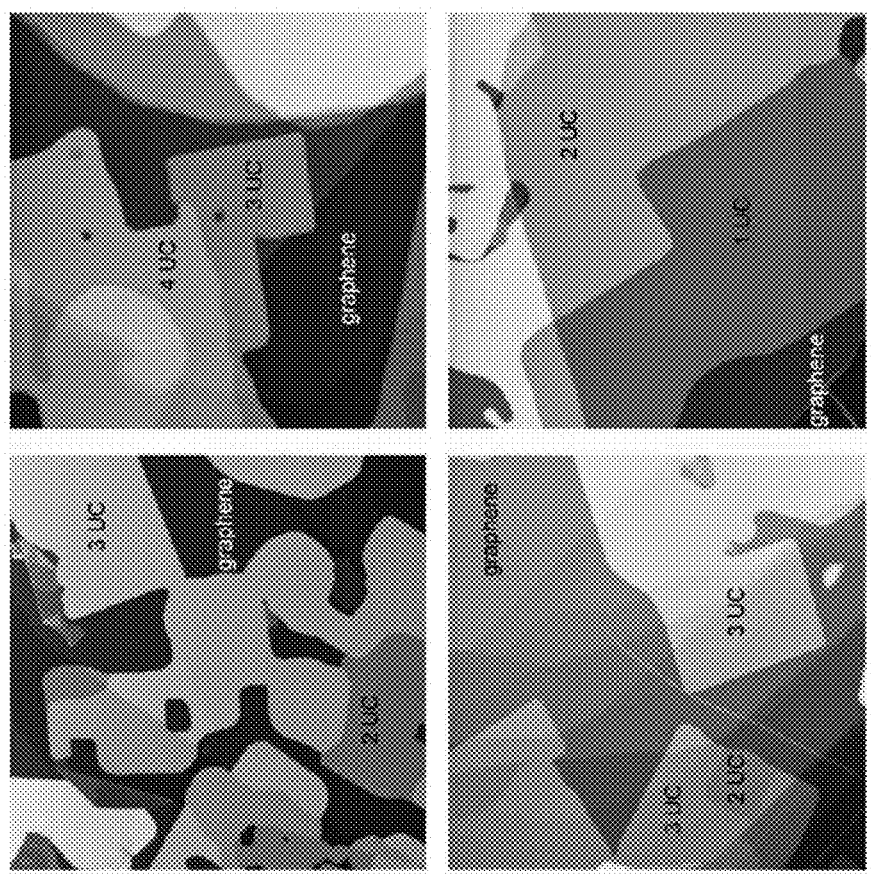
FIG. 7 shows STM topography images of the SnTe films studied in FIGS. 5A and 5B.

FIG. 7 shows STM topography images of the SnTe films studied in FIGS. 5A and 5B. All the images have the same size—500 nm×500 nm. The substrate temperature was 180° C. during growth of the SnTe film. The images were acquired using a sample bias voltage of about 3.0 V and a tunneling current of about 20 pA.

FIGS. 5A-7 show that at low coverage, the (001)-orientated islands are formed on the substrate. At the beginning, SnTe was not grown upon the entire surface of the substrate 6H—SiC, and the coverage is the percent of SnTe on the surface of 6H—SiC. In contrast to the case involving strong directional covalent bonds, the lattice matching conditions are largely relaxed in Van der Waals epitaxy. As a consequence, the in-plane orientation of the SnTe islands is randomly distributed.

FIGS. 8A and 8B show STM topography images of a single UC SnTe island before and after displacement by a STM tip, respectively. The SnTe island has a size of about 200 nm×100 nm. The images were acquired using a sample bias voltage of about 3.0 V and a tunneling current of about 20 pA. FIGS. 8A and 8B show that the STM tip can move the SnTe island on the SiC substrate (with graphene), thereby demonstrating weak Van der Waals bonding between the film and the substrate.

The SnTe films were also characterized at different temperatures to investigate the transition temperature $T_c$. In this investigation, the SnTe films were immediately transferred into the STM without leaving the ultra-high vacuum environment after growth. The STM uses Pt—Ir alloy tips modified and checked on the surface of Ag(111) islands. The dI/dV spectra were recorded with a Signal Recovery lock-in amplifier operating at a modulation frequency of about 913 Hz. The variant temperature experiments were performed between liquid nitrogen temperature (about 77 K) and room temperature. At a first step, a dewar was filled with liquid nitrogen and the SnTe films were placed in the dewar for at least two days to sufficiently cool down the components. Then the liquid nitrogen was removed to allow the whole system to warm up naturally. The thermal shield of the STM is usually good enough to keep the heating process slower than 15 K per day, which leads to a lateral thermal drift of less than 40 nm per hour. During the whole heating process, the sample was canned at least once in every 4 hours. Thermal drift during the waiting time was compensated by manually moving the XY stage of the STM. The data in each dataset was collected from the same area.

Figures 9A, 9B, 9C:
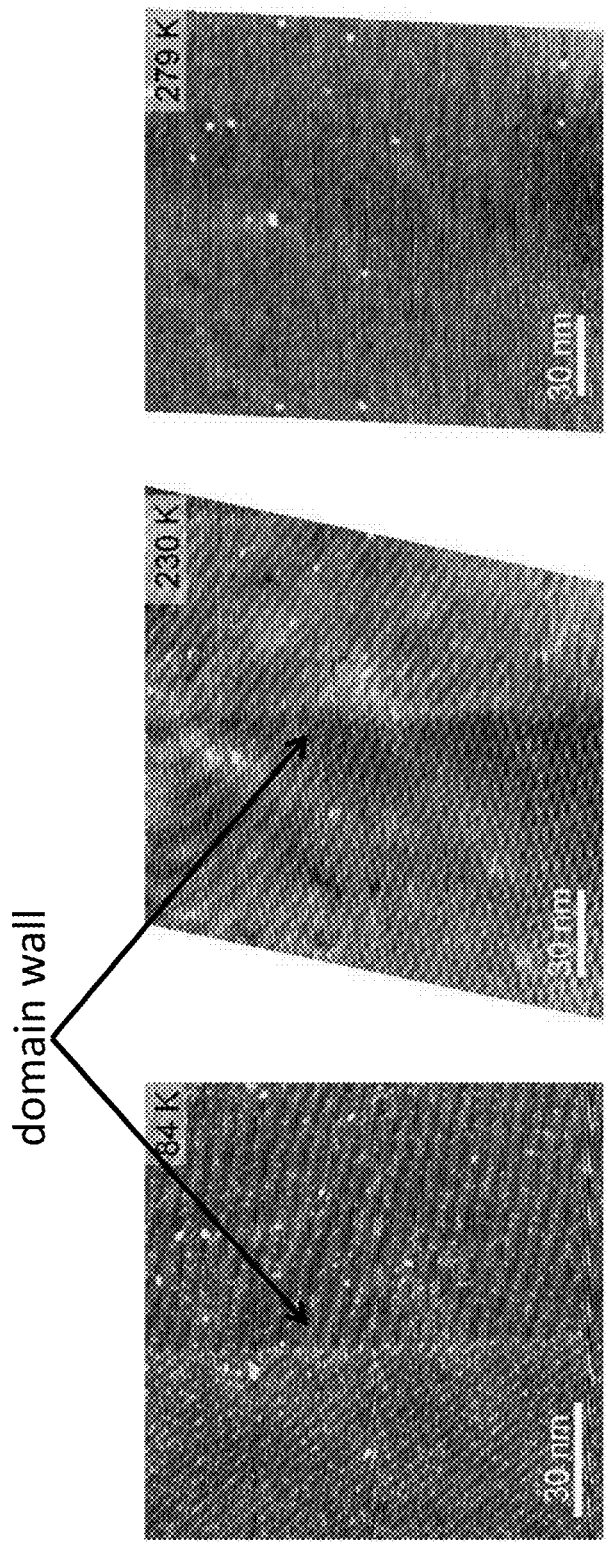
FIGS. 9A-9C show STM topography images of a thin SnTe film at temperatures of 84 K, 230 K, and 279 K, respectively.

FIGS. 9A-9C show STM topography images of a thin SnTe film at a temperatures of 84 K, 230 K, and 279 K, respectively. All the images are acquired from the same area, which can be confirmed by the distribution of the bright spots, which are generated by defects on the substrate. Thermal drift was corrected according to the hexagonal (6×6) superstructure on the substrate. The variant temperature experiment was repeated three times, and the results are well reproduced. The image in FIG. 9A was acquired using a bias voltage of about −0.5 V and a tunneling current of about 10 pA. The image in FIG. 9B was acquired using a bias voltage of about −0.2 V and a tunneling current of about 20 pA. The image in FIG. 9C was acquired using a bias voltage of about −0.1 V and a tunneling current of about 30 pA. FIGS. 9A-9C show that the domain wall persists at a temperature of 230 K but disappears when the temperature is at 279 K, indicating that the transition temperature $T_c$ is about 230 K.

Determining the Thickness of SnTe Films

Figure 10B:
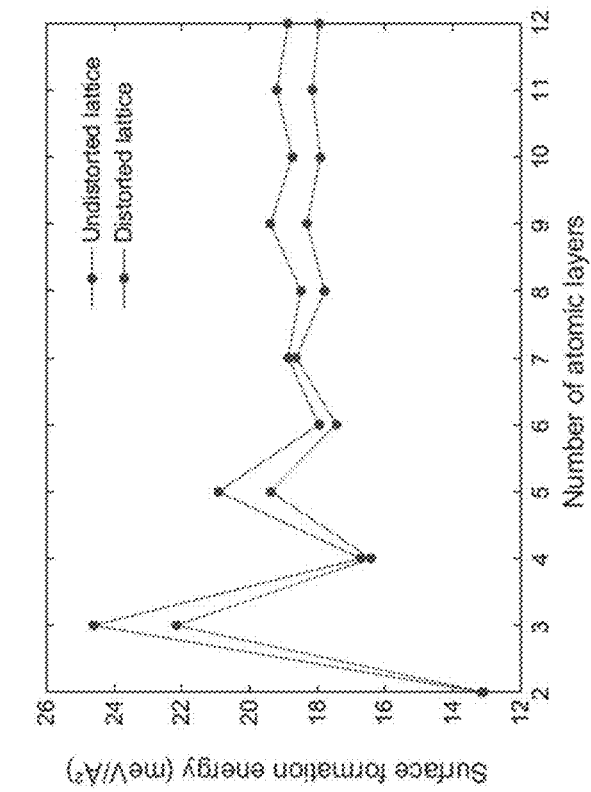
FIG. 10B shows surface formation energy versus number of atomic layers in SnTe films with different thicknesses calculated using density functional theory.
Figure 10A:
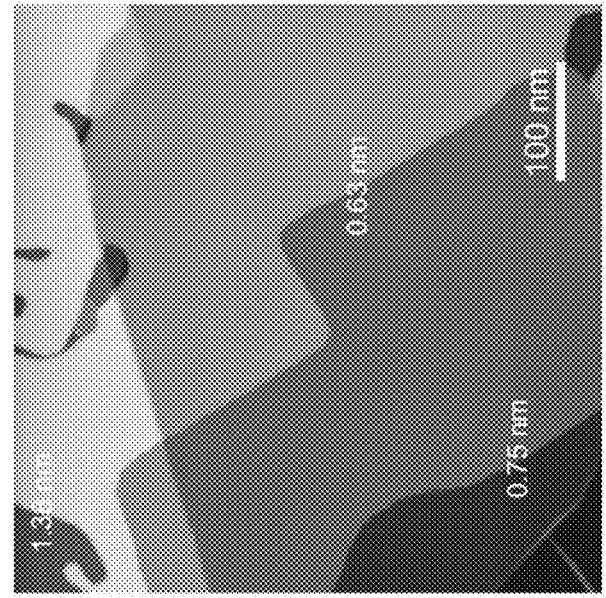
FIG. 10A shows an STM topography image of a SnTe film with step heights labelled at different sections of the film.

The thickness of SnTe films can be determined by a combination of STM topography and first-principle calculations. FIG. 10A shows an STM topography image of a SnTe film with step heights of labelled at different sections of the film. FIG. 10B shows surface formation energy of SnTe films with different thicknesses calculated according to density functional theory. Since the local density of states of SnTe films and the graphene substrate are different, the height of the film edges are not exactly integer multiples of 0.632 nm (the thickness of one UC of SnTe). As shown in FIG. 10A, a height of 0.75 nm can be either 1 UC or 1.5 UC, and a height of 1.38 nm can be either 2 UC or 2.5 UC. However, the height of the step between two SnTe terraces is exactly 0.63 nm. When the thickness of the film is less than 5 UC, the height of the SnTe steps is always 0.63 nm, which implies that the thickness of all the films can be odd or even atomic layers.

The calculation results in FIG. 10B show oscillation behavior: the formation energy of an even-atomic-layer thickness is lower than the neighboring odd-atomic-layer thicknesses. Therefore, the sample SnTe films shown in FIG. 10A have the thickness of even atomic layers, i.e., integer unit cells.

In order to unambiguously determine the thickness, the surface formation energy of the films with different thickness can be calculated. Without being bound by any particular theory of mode of operation, the surface formation energy is defined as $E_S = [E_{0,F} - E_{0,B} \cdot d]/S$, where $E_{0,F}$ is the total energy of the film with the thickness of d, $E_{0,B}$ is the total energy of one atomic layer in bulk SnTe, and S is the surface area of the film. The lattice constants are relaxed to the lowest energy.

The first-principles calculations were based on density functional theory as implemented in the Vienna ab initio simulation package (VASP), by using the Perdew-Burke-Ernzerhof (PBE) generalized gradient approximation and the projector augmented wave potential. The (001) slab model up to 8 UC with 10 Å vacuum layer was used to study the varying of the lattice distortion as a function of the thickness. The corresponding Monkhorst-Pack k mesh was 16×16×1, and the convergence were tested up to 26×26×1. The energy cutoff of the plane-wave basis was 400 eV. The crystal structures were fully optimized with forces converged to less than 0.001 eV/Å. The polarizations were calculated using the modern theory of polarization as implemented in VASP.

During growth (substrate temperature 180° C.), SnTe is likely to exist in the rock salt structure. Thus, the defect study can be constrained within the rock salt structure and take 3×3 inplane supercell with single defect at different depth to investigate the defect formation. The formation energy of defects can be calculated as:

$$\Delta H[X^q] = E_{tot}[X^q] - E_{tot}[\text{per}] + \mu_{Sn} + q(E_v + \Delta V) \quad (1)$$

where $E_{tot}[X]$ and $E_{tot}[\text{per}]$ are the total energies derived from a supercell calculation with one defect X and without a defect, respectively. $\mu_{Sn}$ is the chemical potential of the elemental bulk Sn (diamond cubic phase of Sn(9)), representing Sn-rich condition as Te can easily form $Te_2$ gas desorbing from the surface. q is the charge on the defect, and $E_v$, in expressions for formation energies of charged states, is chosen to be the VBM of the perfect slab. $\Delta V$ is to align the reference potential in the defect supercell with that in the bulk which can be very small (e.g., about 0.01 eV). Moreover, the error associated with charged defect-defect interaction can be smaller than 0.01 eV and can be safely ignore. The defect concentration can be calculated by the Boltzmann distribution $n_v = N_{Sn} \exp(-E_v/k_B T)$, in which $N = 5 \times 10^{14}$ cm$^{-2}$ is the density of Sn sites, $E_v$ is the vacancy formation energy, $k_B$ is the Boltzmann constant and T is the substrate temperature of growth. And the formation energy of thin films is defined as the total energy of the thin films minus the corresponding bulk energy. More information on this calculation can be found in N. Wang et al., "Microscopic origin of the p-type conductivity of the topological crystalline insulator SnTe and the effect of Pb alloying," *Phys. Rev. B* 89, 045142 (2014), which is hereby incorporated herein by reference in its entirety.

Defects in SnTe Films

Figures 11A, 11B:
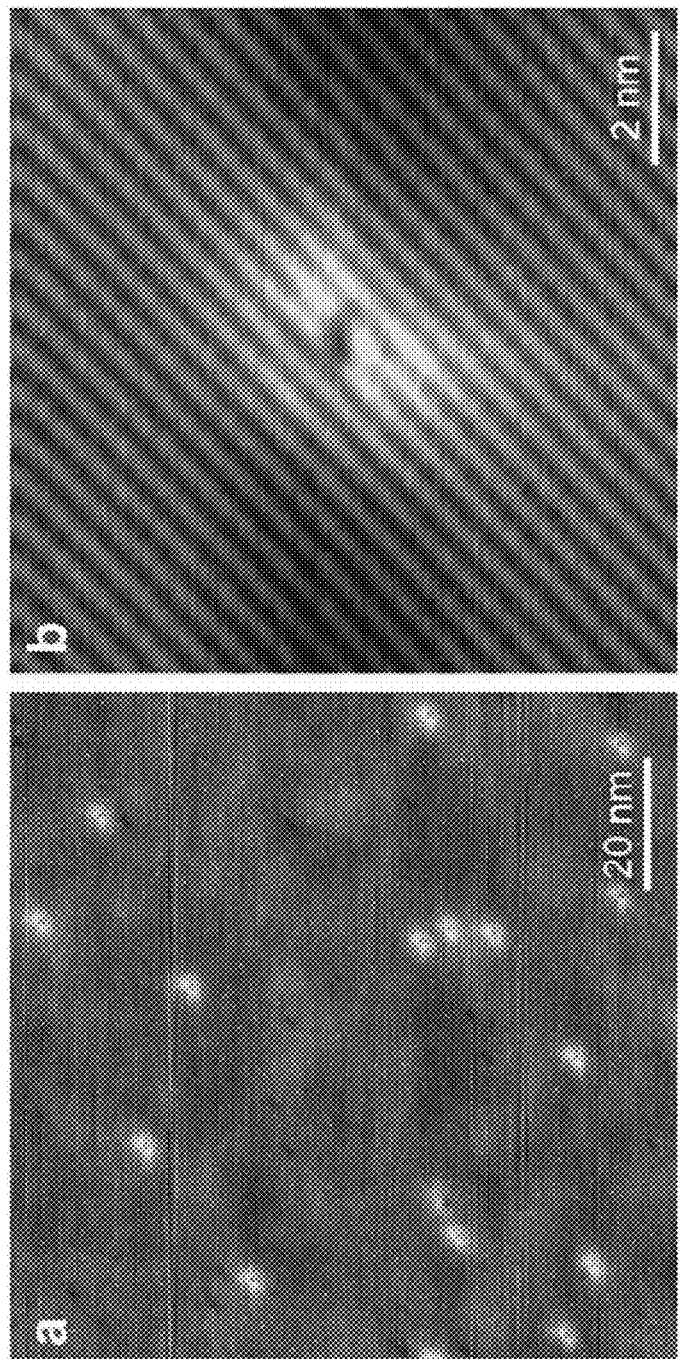
FIG. 11A is an STM tomography image of a 100 nm×100 nm area of a 6 UC film showing Sn vacancies in the film.
FIG. 11B is a 10 nm×10 nm close-up image of one defect shown in FIG. 11A.

The defect density of SnTe films can be determined by counting the Sn vacancies at the topmost atomic layer in the SnTe films. FIG. 11A is an STM tomography image of a 100 nm×100 nm area of a 6 UC film showing Sn vacancies in the film. FIG. 11B is a 10 nm×10 nm close-up image of one defect shown in FIG. 11A. The tunneling condition of both images is at a sample bias voltage of about −0.2 V and a tunneling current of about 20 pA. The bright defects are identified as Sn vacancies in the topmost atomic layer, which has negative charge and locally bends the bands upwards. Some dim defects can also be seen in the image, which are probably the Sn vacancies beneath the topmost layer.

FIGS. 10A-10B and 11A-11B show that by carefully controlling the substrate temperature and SnTe flux, the size of an island can be as large as about 1 μm. The facet edges along the [100] and [010] directions are clearly seen in the STM images. The island thickness corresponds to an integer multiple of the SnTe unit-cell (no half layer), which is consistent with the formation energy calculation (see FIGS. 10A-10B). The topography images in FIG. 11A also indicate that the formation of Sn vacancies can be greatly suppressed in the atomic-thin SnTe films. The surface defect density is $10^{10}$-$10^{11}$ cm$^{-2}$ for the 2 UC film and even lower for the 1 UC one. Both are much lower than that of the bulk material (about $10^{13}$ cm$^{-2}$).

Characterization of Ferroelectricity in SnTe Films

The observed evidences for ferroelectricity include the formation of domain structure, lattice distortion, band bending, and polarization manipulation by electric field.

Figure 12:
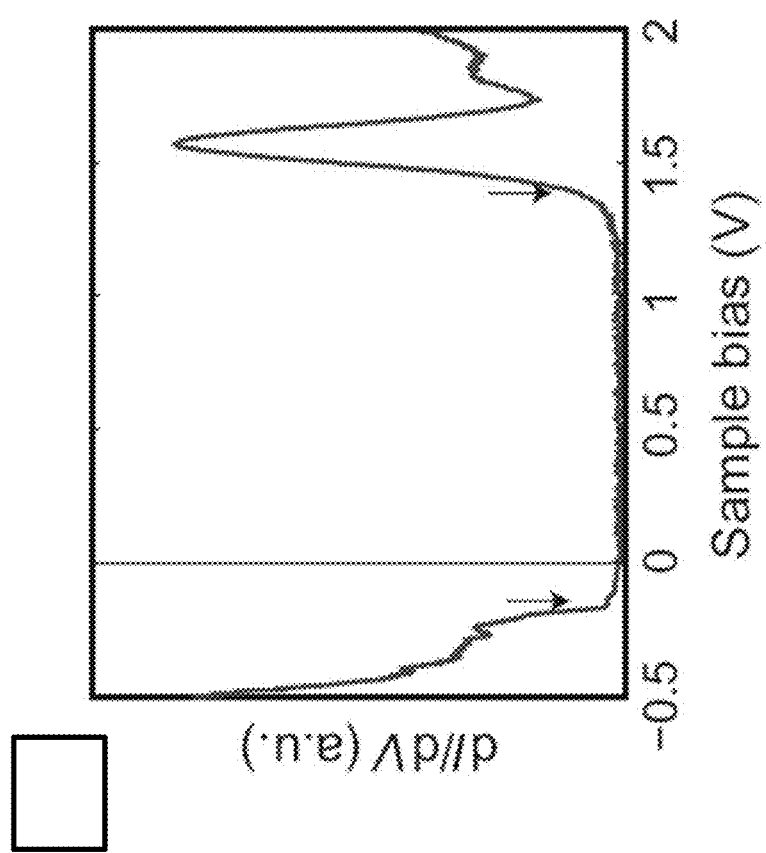
FIG. 12 shows dI/dV spectra acquired on the surface of a 1 UC film at 4.7 K.

FIG. 12 shows dI/dV spectra acquired on the surface of a 1 UC film at 4.7 K. The dI/dV of conduction and valence bands has large differences in intensity. For clarity, the spectra above and below the Fermi level are measured under different tunneling conditions: 3.0 V and 100 pA above, and −0.5 V and 100 pA below. The arrows indicate the edges of the valance and conduction bands, respectively.

The electronic density of states of 1 UC SnTe film can be measured by scanning tunneling spectroscopy (STS). The arrows in the dI/dV curve indicate the band edges. The energy gap of 1 UC film rises to 1.5 eV from its bulk value 0.2 eV.

Figure 13:
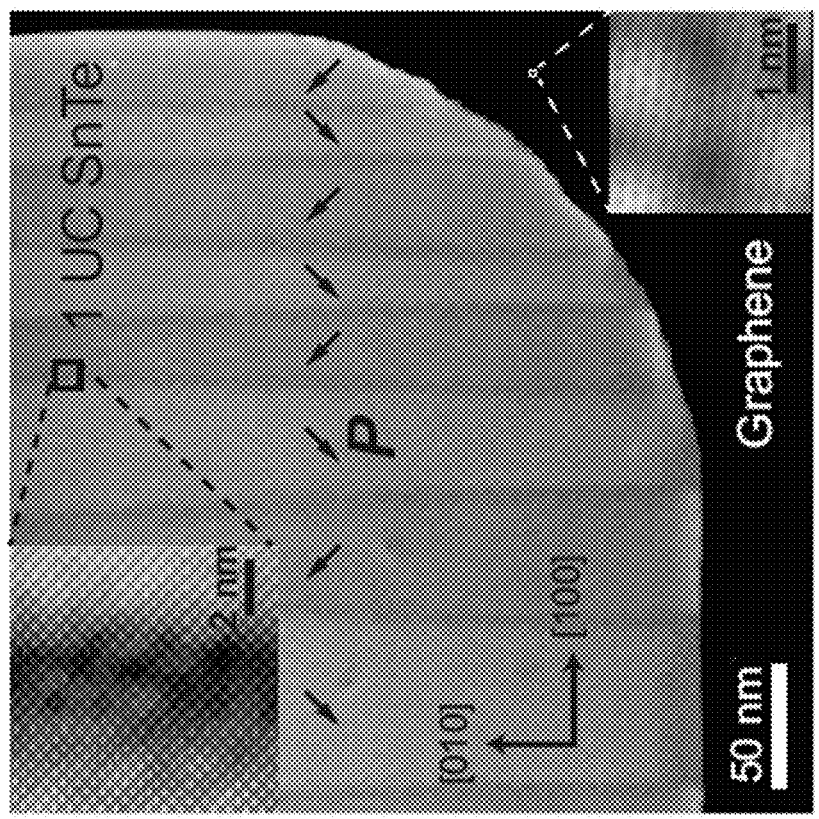
FIG. 13 is an STM topography image of a one UC SnTe film showing stripe domains.

FIG. 13 is an STM topography image of a one UC SnTe film showing stripe domains. The image was acquired with a bias voltage of about −0.2 V, a tunneling current of 30 pA, and at a temperature of about 4.7 K. The arrows in each domain indicate the direction of lattice distortion. The upper inset is a topography image across a domain boundary acquired with a bias voltage of about −0.2 V and a tunneling current of about 100 pA. The lower inset is a topography image of the graphene substrate, acquired with a bias voltage of about −0.1 V and a tunneling current of about 200 pA.

The domain structure in 1 UC SnTe films is resolved in the STM image seen in FIG. 13. The parallel stripes are along the [010] direction. The atomically resolved image shows a quasi-square lattice of Te atoms (the negative bias corresponds to the filled states mainly contributed by Te). The lattice constant of about 4.5 Å is in good agreement with the Te—Te distance in the (001) plane of bulk SnTe. The lattice is also continuous across the domain boundary as seen in the lower inset.

In order to determine the polarization direction of each domain, the lattice parameters within each domain can be measured to decide the elongation direction of the lattice. Usually there are only two possibilities once the elongation direction is fixed. Then one can refer to the band bending at the edge of the island to fix the polarization direction.

Figures 14A, 14B:
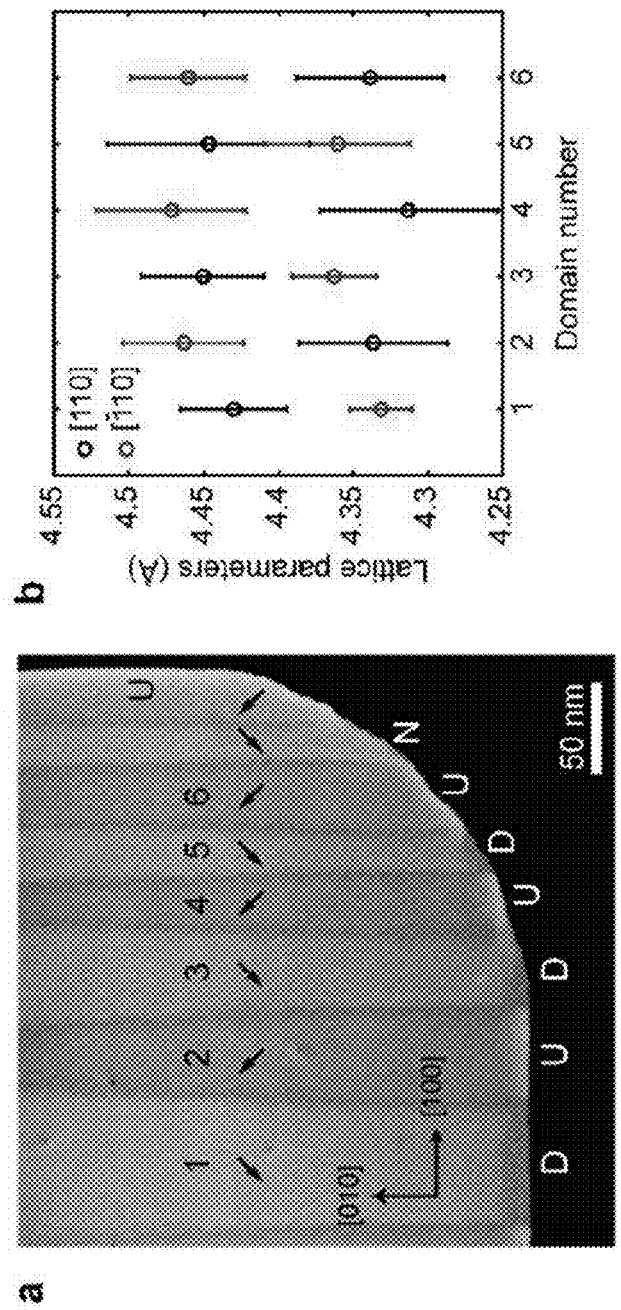
FIG. 14A shows an STM topography image of a one UC SnTe film with labelled band bending directions.
FIG. 14B shows lattice parameter versus domain number for domains 1-6 in FIG. 14A.

FIG. 14A shows an STM topography image of a one UC SnTe film with labelled band bending directions. The letters U, D and N stand for upward, downward and no obvious band bending, respectively. FIG. 14B shows lattice parameters of the domains 1-6 indicated in FIG. 14A. The basis along [110] and [110] are elongated alternatively. These lattice parameters have not been corrected by the (6×6) superstructure because only the relative magnitude is relevant here.

Figure 15:
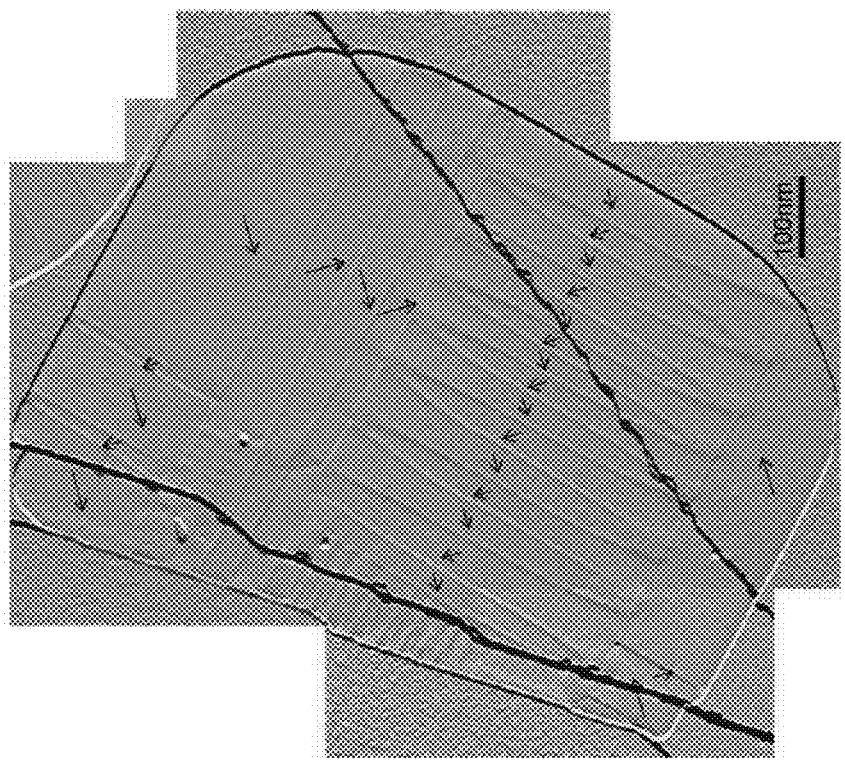
FIG. 15 is an STM image of a large one UC island of SnTe film shown in derivative mode to illustrate multiple domains.

FIG. 15 is an STM image of a large one UC island of SnTe film shown in derivative mode to illustrate multiple domains. The images are acquired under −0.2 V and 20 pA. Derivative mode is used to display the images so that the domain walls can be clearly seen. The arrows indicate the directions of polarization. Note that almost all the domains are at about 90°. The two steps across the island may originate from the SiC substrate. This is quite different from the usual ferroelectrics, in which 180° domain walls dominate. This can be attributed to the two-dimensional nature of the 1 UC film, in which the polarization charges distribute on a line at the edge, rather than on a plane as in bulk ferroelectrics. When no screening is considered, the depolarization field $E_d$ in a two-dimensional ferroelectric film decays with $E_d$~$x^{-1}$. Therefore, the electric potential $\varphi$ varies as: $\varphi$~$\ln(x/\lambda)$, where $\lambda$ is a feature length. In contrast, the depolarization field does not decay in bulk ferroelectrics without screening. In realistic films, $E_d$ decays faster than logarithmic function because of the screening effect of the conducting substrate and finite carrier density in the film.

Figures 16A, 16B:
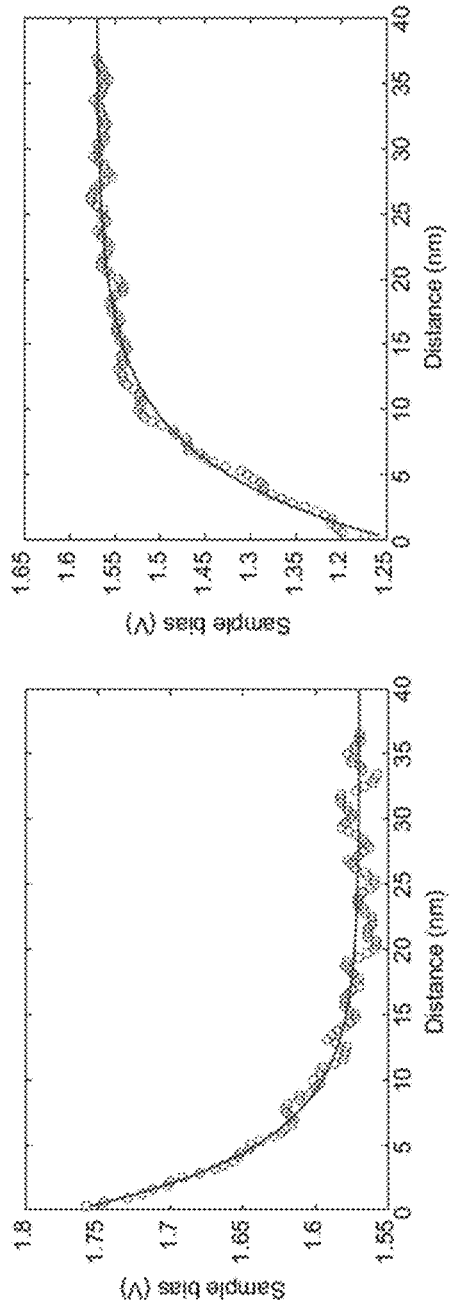
FIGS. 16A and 16B show curve fitting of the band bending profiles near the edges of a one UC SnTe film to an exponential model.

FIGS. 16A and 16B show curve fitting of the band bending profiles near the edges of a one UC SnTe film to an exponential model $V = ae^{-x/\lambda} + c$. In FIG. 16A, a=0.198 V, $\lambda$=4.85 nm, and c=1.57 V. In FIG. 16B, a=−0.329 V, $\lambda$=6.12 nm, c=1.57 V. The circles are the energies of the DOS peak near CBM, and the curves are the fittings. FIGS. 16A and 16B demonstrate the exponential decay of the electric potential. The depolarization field only influences the region within about 20 nm away from the edge. Therefore, it is not necessary to form 180° domains, which may lower the depolarization energy but have higher domain wall energy than that of the 90° domains. The different behaviors in FIGS. 16A and 16B (i.e., decay in FIG. 16A and growth in FIG. 16B) are related to the polarization direction and the sides of ferroelectric materials. For example, if the polarization field is along right direction, the potential around the right edge decays, but the potential around the left edge increases. Such differences make the tunneling currents around different edges or same edges with opposite polarization are different.

Figures 17A, 17B, 17C:
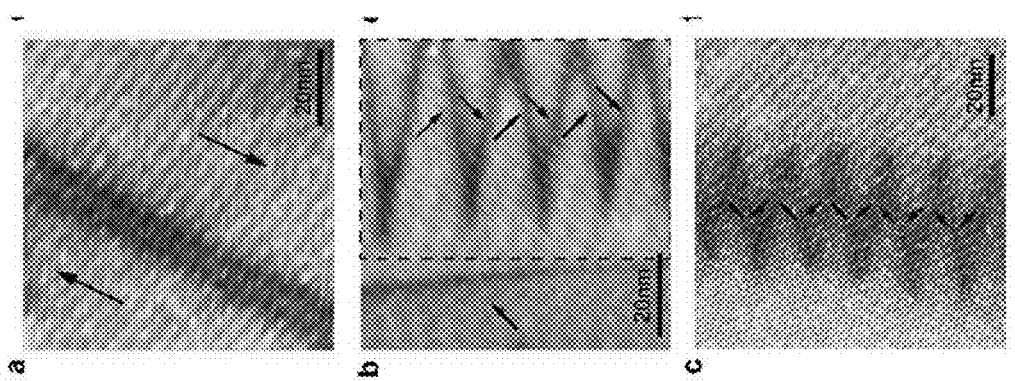
FIGS. 17A-17I illustrate various types of domain boundaries in one UC SnTe films.
Figure 17F:
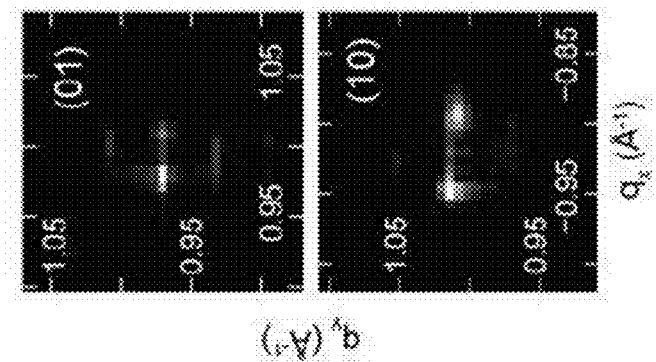
Figure 17E:
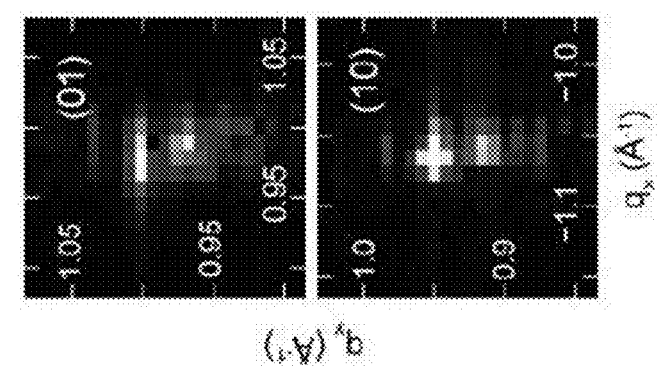
Figure 17D:
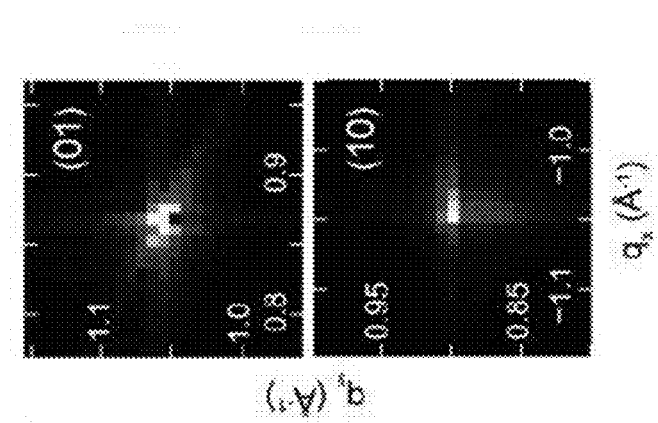
Figure 17I:
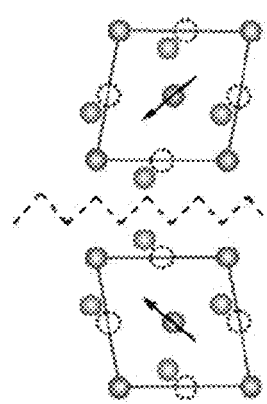
Figure 17H:
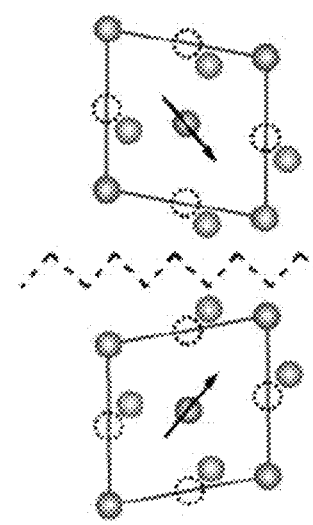
Figure 17G:
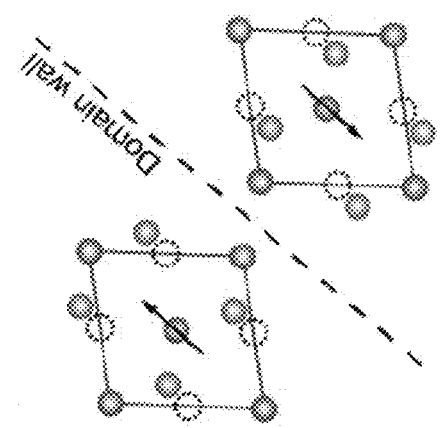

FIGS. 17A-17I illustrate various types of domain boundaries in one UC SnTe films. FIGS. 17A-17C show atomically resolved topography images of the domain boundaries. The arrows indicate the directions of polarization. FIGS. 17D-17F show Fourier transforms of the Te sublattices shown in FIGS. 17A-17C, respectively. FIGS. 17G-17I show structure models of the domain boundary shown in FIGS. 17A-17C, respectively. The wedge angles are 21° in FIG. 17B and 29° in FIG. 17C. These images also show that 180° and 90° wedge-shaped domain walls are occasionally observed in 1 UC SnTe films.

Figure 18:
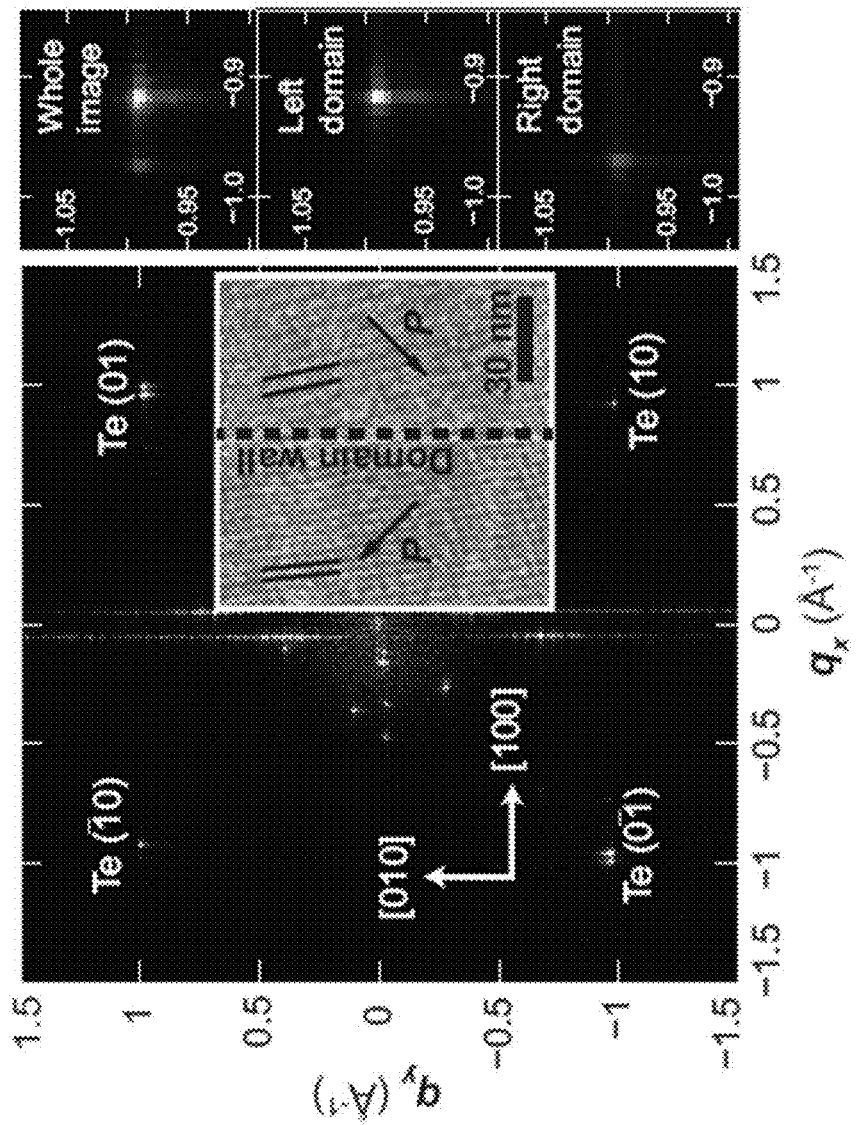
FIG. 18 shows a Fourier transform of an area in an STM image of a thin SnTe film crossing a domain boundary.

FIG. 18 shows Fourier transform (left) of an area (inset, 4.7 K) in an STM image of a thin SnTe film crossing a domain boundary. The Bragg peaks are associated with the Te sublattice. The parallel lines in the inset indicate the Moiré stripes in each domain. The atomically-resolved image right on the domain boundary is shown in FIG. 19B. The Te(10) peaks for the whole image, the left domain, and the right domain are enlarged in the right panels, respectively.

FIG. 19A shows the STM image in FIG. 18 with the boundary region labelled in a dashed rectangular box. The entire image has an area of about 120 nm×120 nm. FIG. 19B shows a close-up of the boundary region. FIG. 19C shows the Fourier transformed image of the STM image in FIG. 19A. The quasi-square spots from SnTe lattice and the hexagonal spots from SiC-(6×6) superstructure are indicated.

FIGS. 20A-20F show simulation results of the Moiré pattern observed in FIG. 18. FIGS. 20A and 20D show the Fourier transformed image of the left domain and right domain, respectively. FIG. 20B shows the simulated Moiré pattern, with lattice parameters $a_{1S}$=4.6 Å, $a_{2S}$=4.4 Å for SnTe and $a_{1G}$=$a_{2G}$=2.46 Å for graphene. The angle between $a_{1S}$ and $a_{1G}$ is 50°. The fluctuation induced by the SiC-(6×6) superstructure, whose basis rotate 30° about that of graphene, is also superposed. FIG. 20C shows the Fourier transformed image of FIG. 20B. FIG. 20E shows the simulated Moiré pattern with $a_{1S}$=4.4 Å, $a_{2S}$=4.6 Å and $a_{1G}$=$a_{2G}$=2.46 Å. The angle between $a_{1S}$ and $a_{1G}$ is 48°. FIG. 20F shows the Fourier transformed image of FIG. 20E.

The STM image in FIG. 18 has two domains divided by the domain wall labelled in the image. The Fourier transformed images show three types of spots: 1) quasi-square shaped spots at larger q; 2) hexagonal shaped spots at small q; and 3) some other irregular spots at small q, as FIG. 19C indicates. The quasi-square spots 1) are from the quasi-square SnTe lattice quasi-square lattice. The hexagonal spots 2) correspond to the (6×6) superstructure in the buffer layer of the SiC substrate with |q|=0.39 Å. The irregular spots 3) come from the Moiré pattern between the quasi-square SnTe lattice and hexagonal graphene lattice, as presented in FIGS. 20A-20F.

The lattice parameters of the distorted SnTe lattice can also be determined from the Fourier transformed images. All the Fourier transform images are corrected by the spots of the (6×6) superstructure, which act as a natural in situ reference system.

Figure 21A:
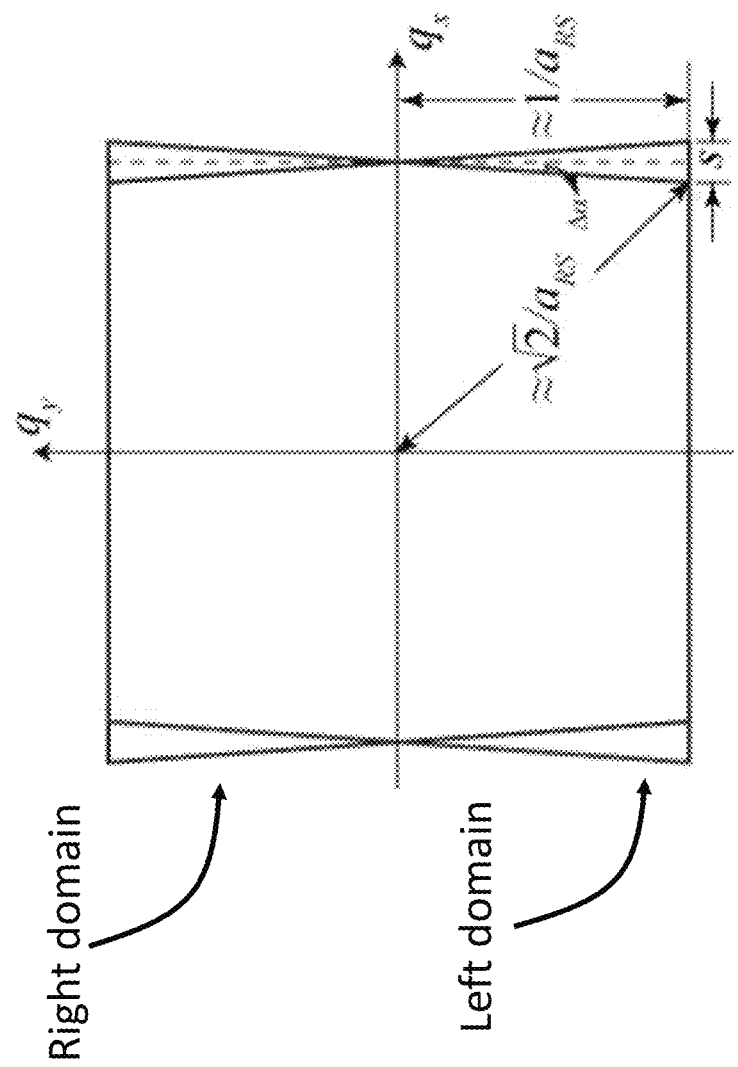
FIG. 21A shows a schematic illustrating the calculation of the distortion angle from the splitting of the SnTe spots.
Figure 21B:
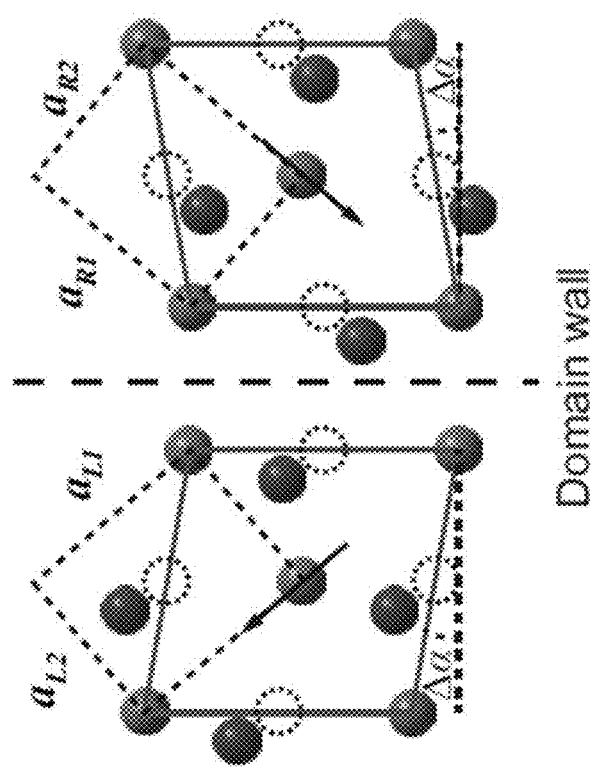
FIG. 21B shows a schematic of lattice distortion and atom displacement in the ferroelectric phase.

FIG. 21A shows a schematic illustrating the calculation of the distortion angle from the splitting of the SnTe spots. The parallelograms representing the SnTe spots from the left- and right-domain are labelled. FIG. 21B shows a schematic of the lattice distortion and atom displacement in the ferroelectric phase. The solid lines indicate the rock salt unit cell and the dashed lines indicate the primitive cell of the Te sublattice. The arrows point to the directions of distortion. $\alpha_{L1}$, $\alpha_{L2}$, $\alpha_{R1}$ and $\alpha_{R2}$ are the basis of the primitive cell, and $\Delta\alpha$ is the distortion angle of the rock salt unit cell.

Figure 22:
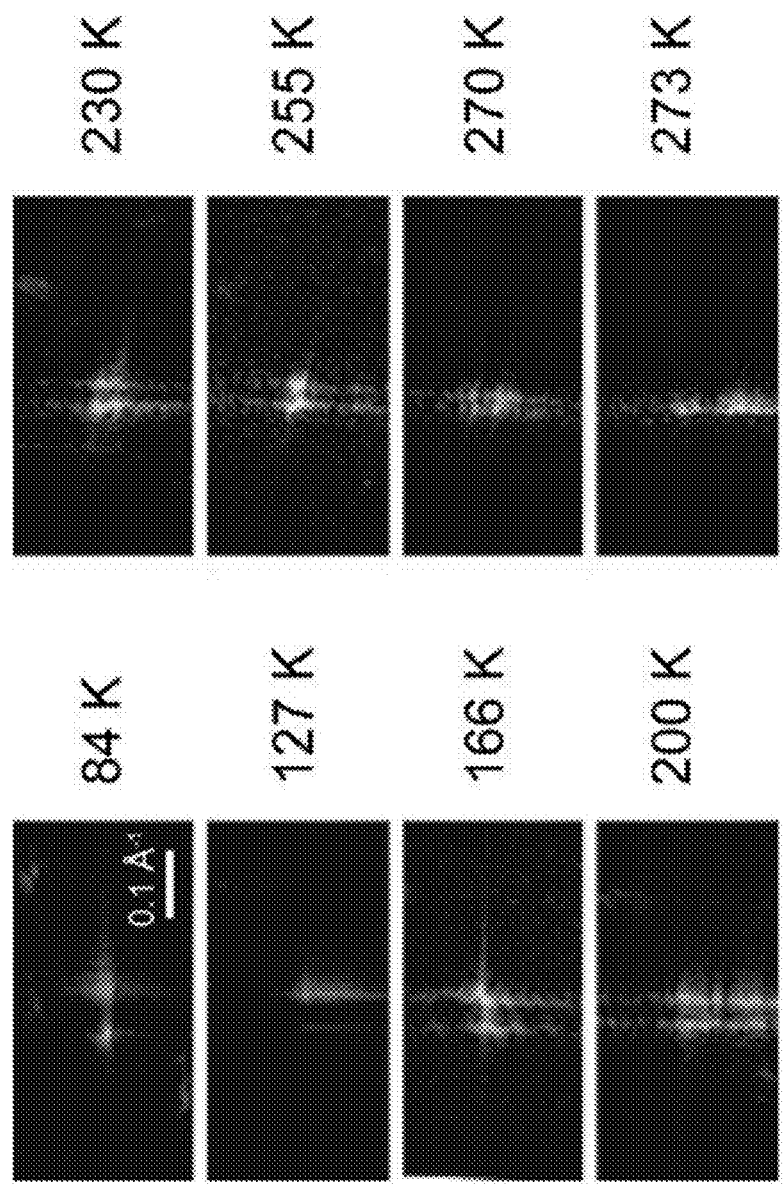
FIG. 22 shows the splitting of the Te(10) spots at different temperatures.

FIG. 22 shows the splitting of the Te(10) spots at different temperatures. The thermal drift has been corrected according to the hexagonal spots from the (6×6) superstructure. All the images are in the same scale.

The distortion angle $\Delta\alpha$ of the rock salt unit cell can be determined in better precision than the other lattice parameters. The geometry is shown in FIG. 21A. The distortion angle can be calculated by $\Delta\alpha = sa_{RS}/2$, in which s is the splitting of the spots and $a_{RS}$=6.32 Å is the lattice constant of the undistorted rock salt unit cell, an acceptable approximation within the resolution of the instrument. As FIG. 22 shows, although the spots are broadened along the slow-scan direction, the resolution along the fast-scan direction is still good. The fast-scan direction was kept parallel with one base of the rock salt unit cell in all the images. When the temperature is close to $T_c$, the splitting becomes smaller and smaller.

In order to correctly identify the spots, Fourier transform can be performed on each domain and the (lateral) coordinates of the spots can then be measured.

Figure 23:
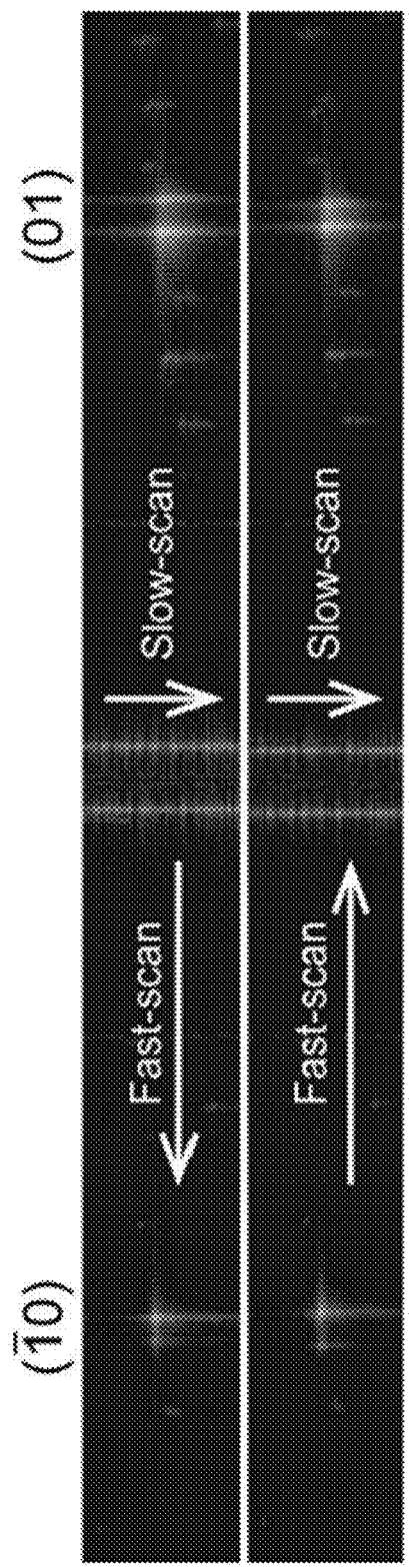
FIG. 23 shows Fourier transforms of two atom resolved topography images recorded at the same time, with opposite fast-scan directions.
Figure 24:
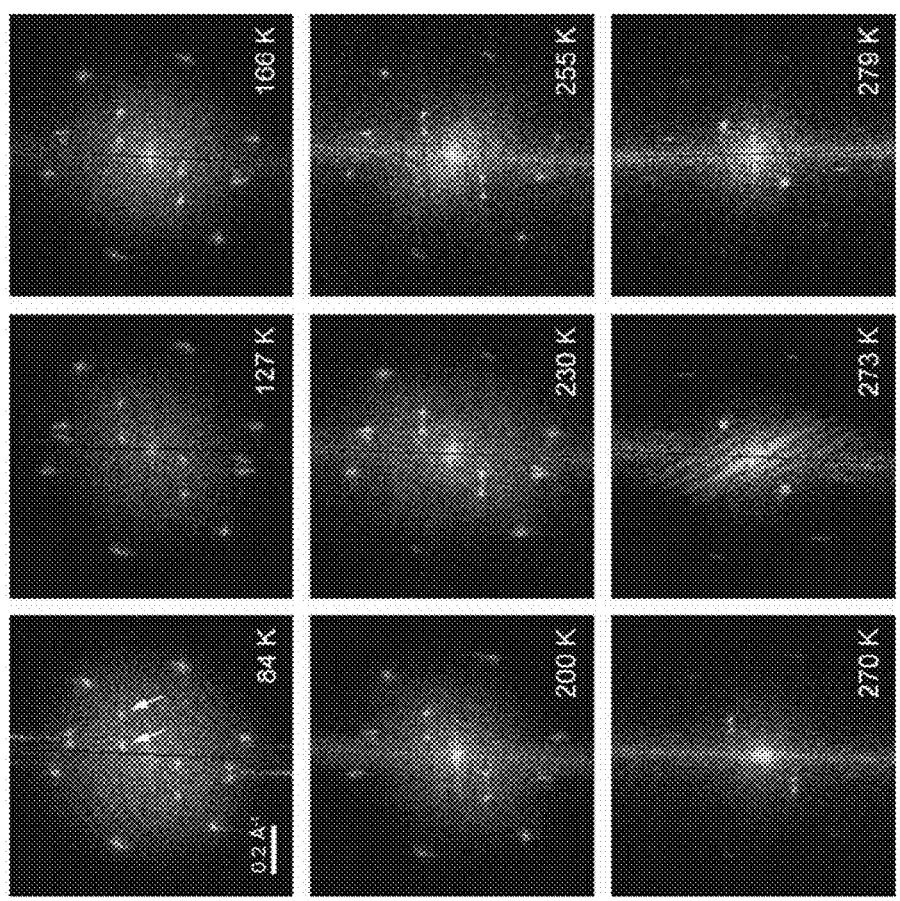
FIG. 24 shows the splitting of the Moiré pattern spots at different temperatures.

FIG. 23 shows Fourier transformed images from two atom resolved topography images recorded at the same time, with opposite fast-scan directions. FIG. 24 shows the splitting of the Moiré pattern spots at different temperatures. The thermal drift has been corrected according to the hexagonal spots from the (6×6) superstructure.

In FIG. 18, the splitting of the Te(10) spots is a little larger than the Te(01) spots. This is the result of the nonlinear response of the piezoelectric scanner. As shown in FIG. 23, when the fast-scan direction is reversed, the magnitude of the splitting of Te(10) and Te(01) is also exchanged. A simple method to correct this error is to average the splitting values measured from the images with opposite fast-scan directions.

Since the Moiré pattern can be very sensitive to the change of the lattice parameters of SnTe, the splitting of the spots from the Moiré pattern can be even larger than the spots from SnTe lattice in the Fourier transformed images. FIG. 23 clearly shows how the split Moiré pattern spots getting closer as the temperature increases, and finally merging with each other above $T_c$.

FIGS. 18-25 together show that the Fourier transform of an area containing two domains (STM image in the inset of FIG. 18) clearly exhibits two sets of Bragg peaks split along the [100] direction. Each set of the Bragg peaks is contributed by one domain (see the right panels of FIG. 18). The lattice is slightly distorted from a perfect square to a parallelogram (see, FIG. 21B). From the Fourier transform, the two bases of the Te sub-lattice at liquid helium temperature are found to be 4.58±0.05 Å and 4.44±0.05 Å, respectively. The parallelogram is elongated along the [110] and its equivalent orientations (indicated by arrows in FIG. 21B).

The elongated diagonals for two adjacent domains are perpendicular to each other. As shown later, the in-plane polarization is along those diagonals.

Figures 25A, 25B, 25C:
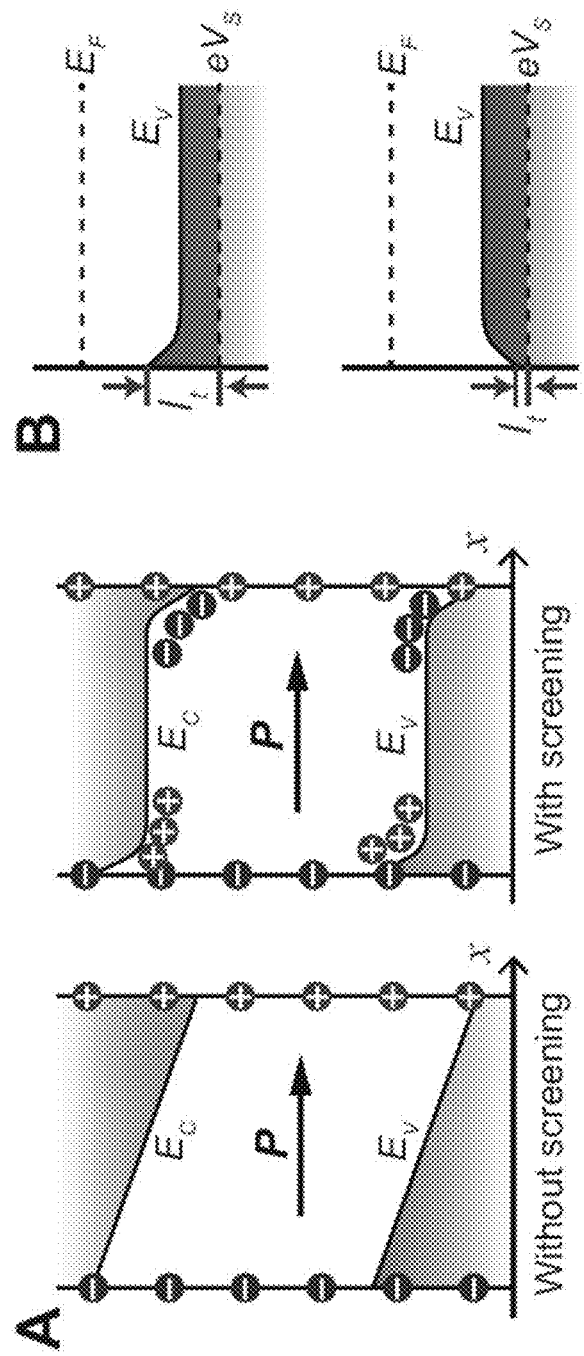
FIGS. 25A and 25B illustrate band shifts of a bulk ferroelectric SnTe with and without internal screening charge, respectively.
FIG. 25C shows band diagrams of thin SnTe films illustrating the apparent heights of the edge.

FIGS. 25A and 25B illustrate band shifts of a bulk ferroelectric SnTe with and without internal screening charge, respectively. A more direct manifestation of ferroelectricity can come from the band bending at the edge of an island in a SnTe film. In general, the discontinuity of polarization on the border of a dielectric induces the polarization charge, and its density is given by P·n. Here P and n are the polarization and the normal direction, respectively. So if one surface is positively charged, the opposite surface is negatively charged. The electric field generated by the polarization charge shifts the bulk electronic bands as seen in FIGS. 25A-25B. If there are free carriers owing to doping, the screening effect confines the band bending within the vicinity of the borders (FIG. 25B). Band bending has various origins and is commonly observed on surfaces. However, one feature on the surfaces of a ferroelectric is that the bending directions are opposite to each other on the opposite surfaces of a domain: one side is upward and the other side is downward.

FIG. 25C shows band diagrams of thin SnTe films illustrating the apparent heights of the edge. If an edge is negatively charged (top panel), more states between $E_F$ and $eV_s$ are available for tunneling. Therefore the STM tip can be lifted up to keep a constant current during scanning, giving rise to a higher apparent height. The positively charged edge has the opposite trend.

In fact, the signature of band bending has already emerged in FIG. 13. In the STM image (constant current mode at −0.2 V), the height of the island edge is different from that of the bulk and the edges for two adjacent domains show opposite variation in height. The observed pattern can be easily explained by the band bending effect if the polarization direction is indeed given by the arrows in FIG. 13. As illustrated in FIG. 25C, the band gap at an edge is shifted by the polarization charge. The positive charge moves the band downward and there is less density of states between the bias voltage Vs and the Fermi level. Therefore the apparent height of a positively charged edge is lower than that of the bulk. Similarly, a negatively charged edge appears higher.

Figures 26A, 26B:
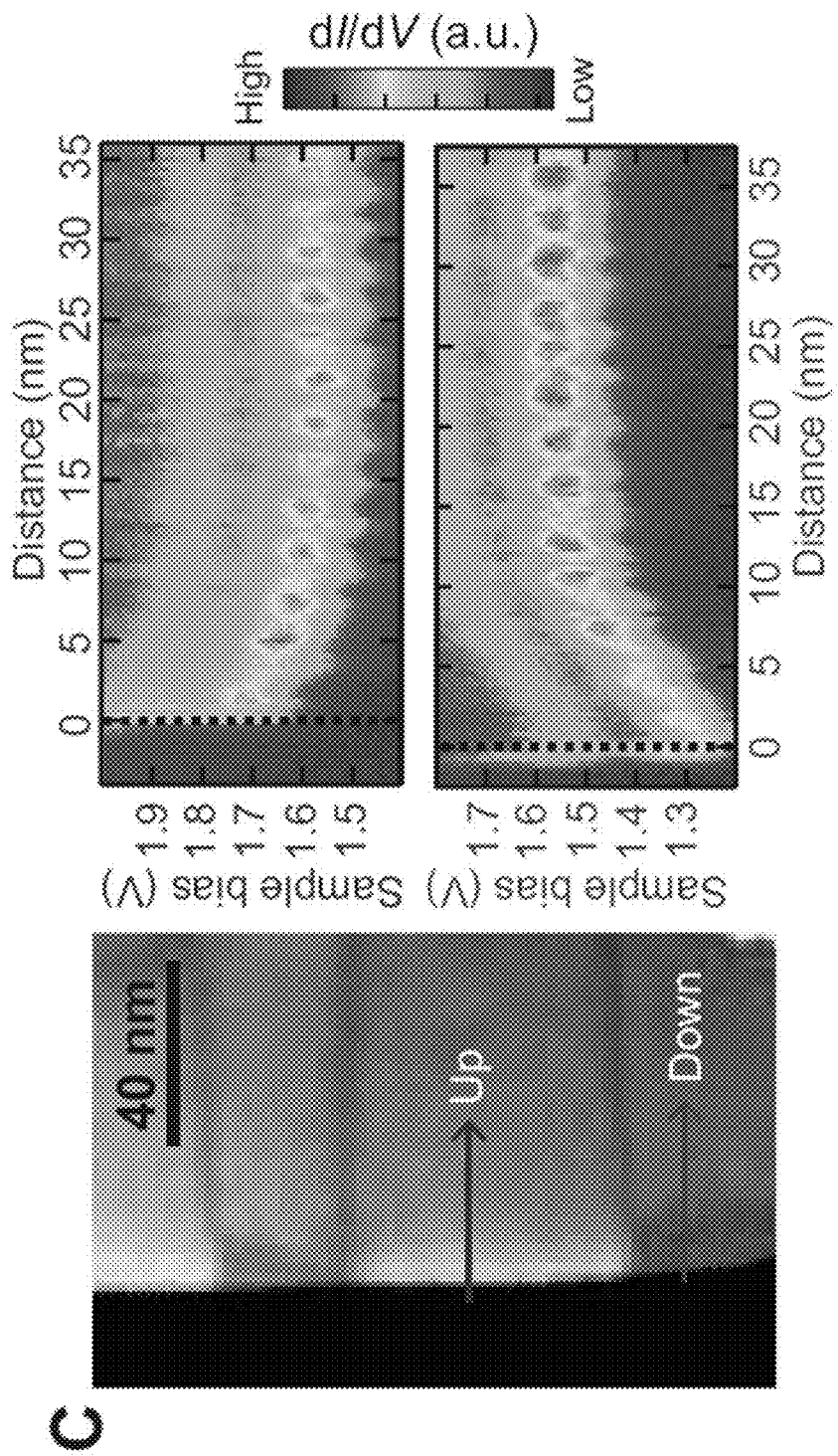
FIGS. 26A and 26B illustrate band bending via spatially resolved dI/dV spectra of STM images of SnTe films.

FIGS. 26A-26B illustrate band bending via spatially resolved dI/dV spectra of STM images of SnTe films. FIG. 26A shows an STM image of a thin SnTe film with two arrows indicating the direction of the dI/dV spectral shown in FIG. 26B. The band bending is even more clearly observed by following the peak at 1.5 V in dI/dV curve as a function of the distance to an edge. Spatially resolved dI/dV spectra are taken along the lines perpendicular to the edges of two adjacent domains. The peaks shift to opposite directions up to 0.2 eV with a screening length of about 10 nm.

Figures 27A, 27B:
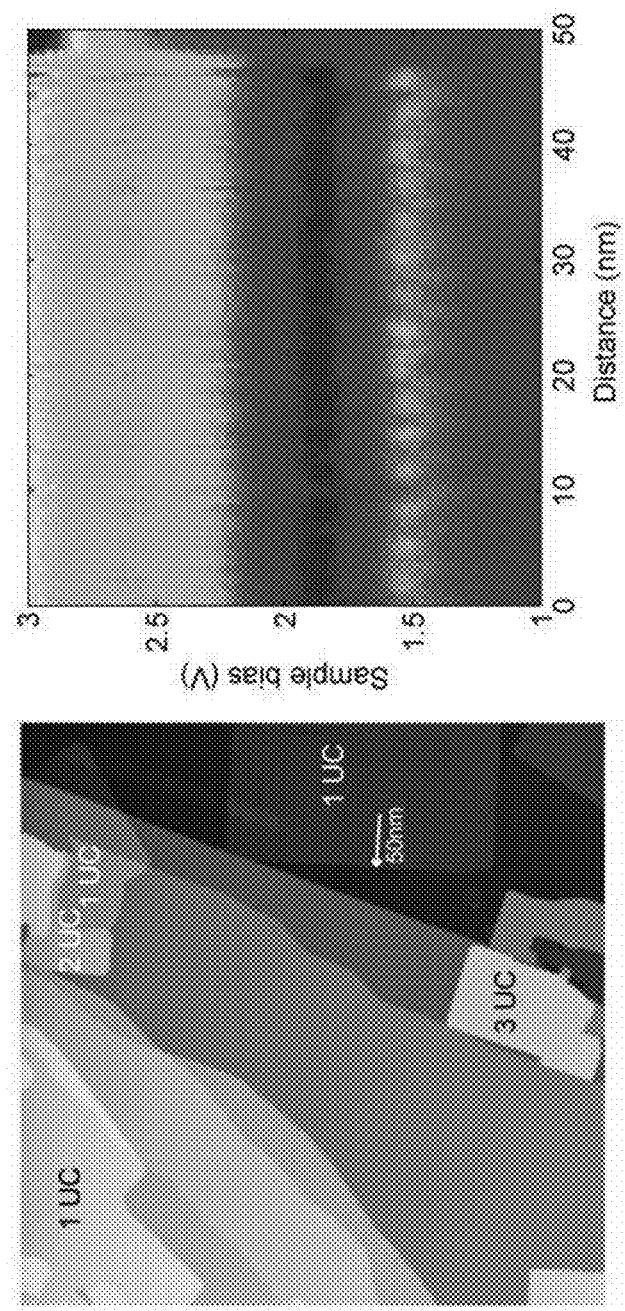
FIG. 27A shows an STM image of a PbTe film grown on a SiC substrate.
FIG. 27B shows spatially resolved dI/dV spectra along the line perpendicular to the edge of a 1 UC PbTe island.

For comparison, no band bending is observed in 1 UC PbTe film as shown in FIGS. 27A-27B. FIG. 27A shows an STM image of a PbTe film grown on a SiC substrate. FIG. 27B shows spatially resolved dI/dV spectra along the line perpendicular to the edge of a 1 UC PbTe island. PbTe films have an identical NaCl structure and very similar electronic structure with para-electric SnTe films. Both the bulk material and films of PbTe are para-electric. This result further supported that the band bending in SnTe films is induced by spontaneous polarization. The dI/dV mapping is also performed on a 1 UC PbTe island and shows no band bending effect.

Figure 28:
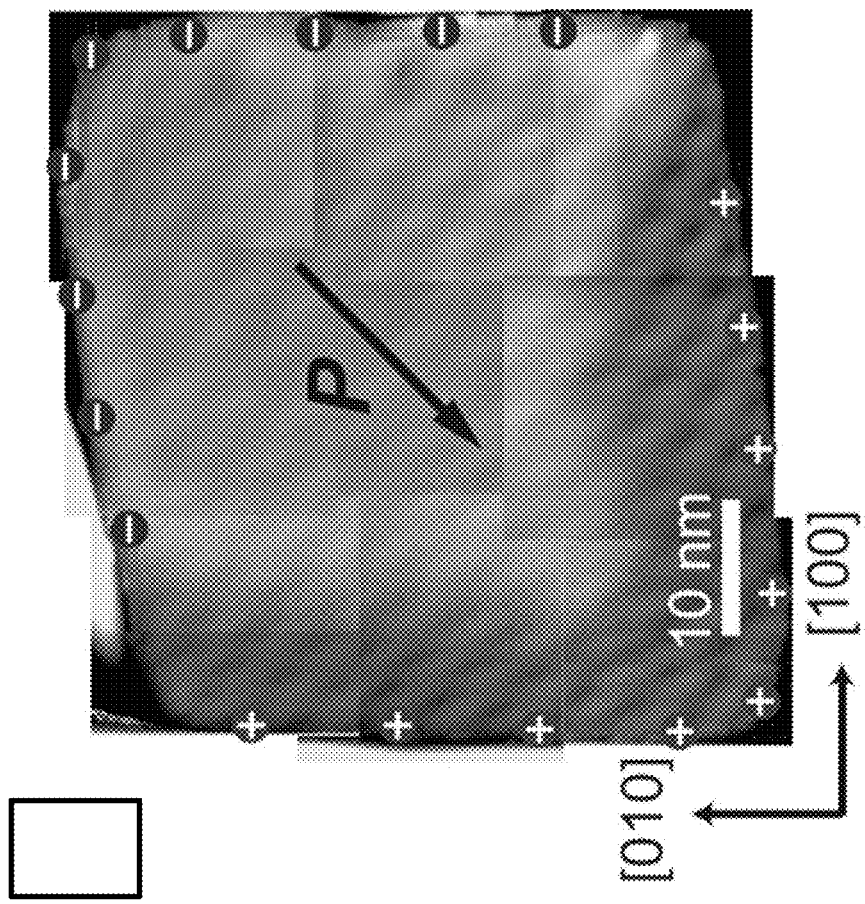
FIG. 28 shows an STM image of a domain island in a one UC SnTe film with polarization direction determined to be along the [110] direction.

FIG. 28 shows an STM image of a domain island in a one UC SnTe film with polarization direction determined to be along the [110] direction. The image is a combination of nine smaller scans. The "+" and "−" signs on the edges indicate the positive and negative polarization charges.

FIGS. 29A and 29B show STM topography images of a one UC SnTe film before and after a voltage pulse is applied, respectively. The arrows indicate the direction of polarization.

The polarization orientation can be unequivocally determined by the band bending pattern on a single domain island as seen in FIG. 28. The reversed bending on the opposite edges of the squared island clearly demonstrates that the polarization of 1 UC SnTe film has in-plane component along the [110] diagonal. With the in-plane polarization determined by lattice distortion together with the sign change of polarization charge on edges, different types of domain walls can be classified. The straight domain walls in FIG. 13 belong to the 90° "head-to-tail" type. The "head-to-head" domain wall in FIGS. 29A and 29B shows the zigzag pattern to minimize the electrostatic energy. Occasionally, the in-plane 180° domain wall is also observed in FIGS. 29A-29B. More images of domain structures can be found in FIG. 15 and FIGS. 17A-17C.

One more feature for ferroelectricity is that the polarization can be manipulated by electric field. A ferroelectric crystal has two or more orientational states for polarization, which can be shifted from one to another by an electric field. To tune the ferroelectric state, a voltage pulse was applied between the STM tip and the 1 UC SnTe film. The domain structure of the film was distinctly changed by the pulse, as seen by comparing FIG. 29A and FIG. 29B. This tunability distinguishes ferroelectric from other polar states.

Figure 30A:
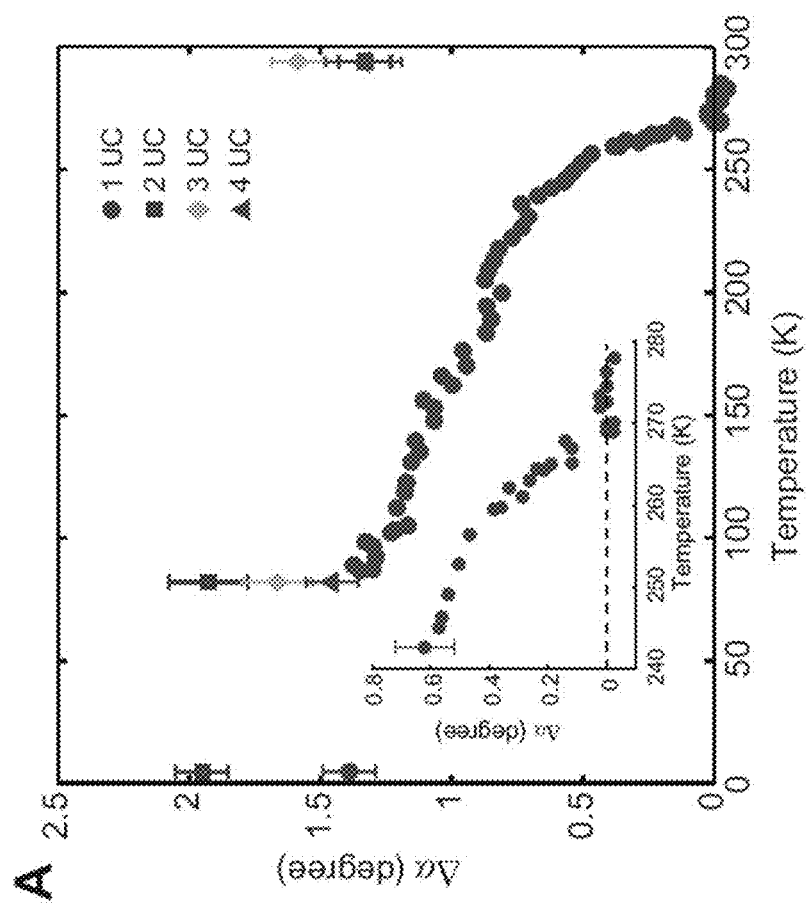
FIG. 30A shows distortion angles as a function of temperature in SnTe films having a thickness of 1 UC to 4 UCs.
Figure 30B:
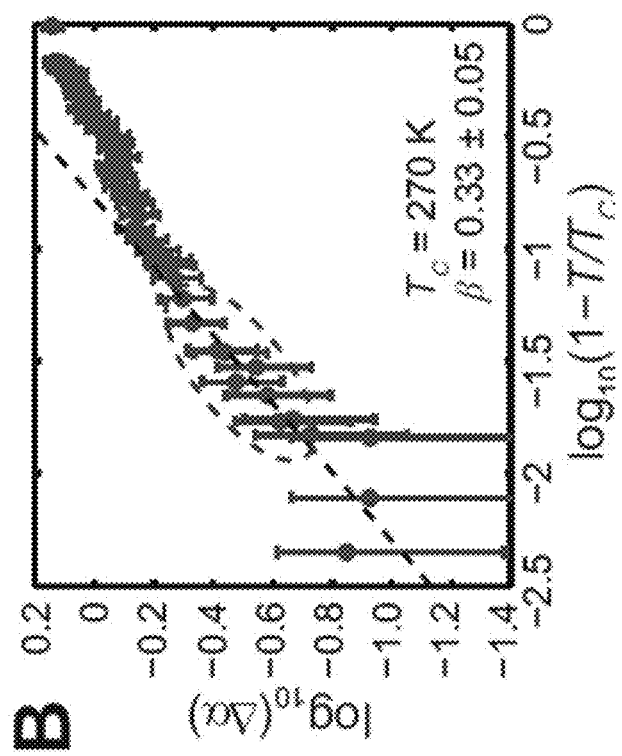
FIG. 30B shows power-law fitting of the data shown in FIG. 30A for 1 UC SnTe film near the transition temperature $T_c$ at about 270 K.

FIG. 30A shows distortion angles as a function of temperature in SnTe films having a thickness of 1 UC to 4 UCs. The inset shows the distortion angle near $T_c=270$ K for the 1 UC film exhibiting the behavior of a second-order phase transition. The 2~4 UC films show significant distortion even at room temperature. FIG. 30B shows the power-law fitting of the data shown in FIG. 30A for 1 UC SnTe film near $T_c$. The critical exponent of P is derived using the approximation $P^2 \sim \Delta\alpha$. The ellipse of the dash line indicates the data points for linear fitting.

The above studies, including the formation of domain structure, lattice distortion, band bending, and polarization manipulation by electric field, strongly support the occurrence of ferroelectricity in the 1 UC SnTe film. Stronger indication is seen in the experiments at higher temperatures, where the spontaneous polarization P diminishes and eventually disappears at the ferroelectric transition temperature $T_c$.

During the variable temperature measurement, the distortion angle $\Delta\alpha$ of the rock salt unit cell is conveniently determined by the separation between the two sets of Bragg peaks (see, FIG. 22). The polarization is then derived through the relation $P^2 \sim \Delta\alpha$. The temperature dependence of $\Delta\alpha$ is plotted in FIG. 30A. For the 1 UC film, $\Delta\alpha$ drops as the temperature increases and becomes zero at Tc=270 K. The critical temperature for 1 UC film is much higher than the bulk value of about 100 K. Within the precision of measurement, $\Delta\alpha$ approaches zero continuously at $T_c$ (see inset of FIG. 30A), which is in agreement with the behavior for a second order phase transition. The critical index $\beta=0.33\pm0.05$ ($P\sim(T_c-T)^\beta$) is extracted by plotting $\Delta\alpha$ versus T on a log-log scale (see, FIG. 30B). The critical exponent here is identical to the value, 0.33, observed in the $PbZr_{0.9}Ti_{0.1}O_3$ bulk material and larger than the values of current available two-dimensional (2D) models with short range interaction, such as ⅛ of the 2D Ising model. It indicates that long-range correlated microscopic model is required to fully account the observed result here.

Figure 31C:
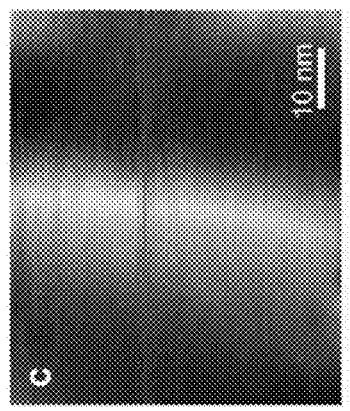
FIGS. 31A-31C show STM topography images of the domain boundaries for 2 UC SnTe films, 3 UC SnTe films, and 4 UC SnTe films, respectively.
Figure 31B:
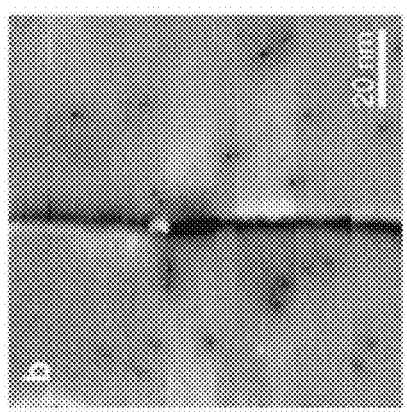
Figure 31A:
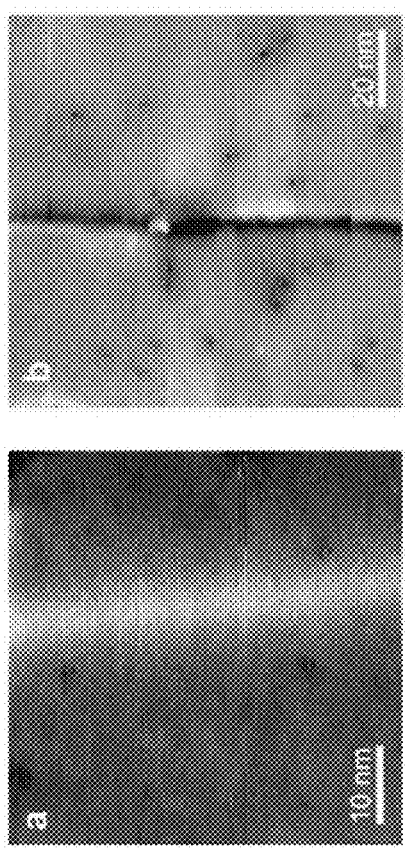
Figure 31F:
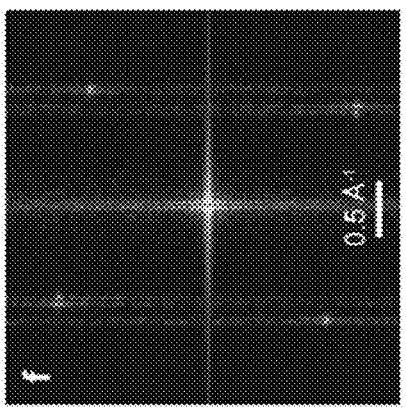
FIGS. 31D-31F show Fourier transforms of the images in FIGS. 31A-31C, respectively.
Figure 31E:
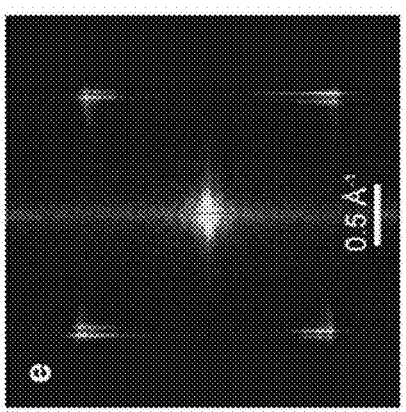
Figure 31D:
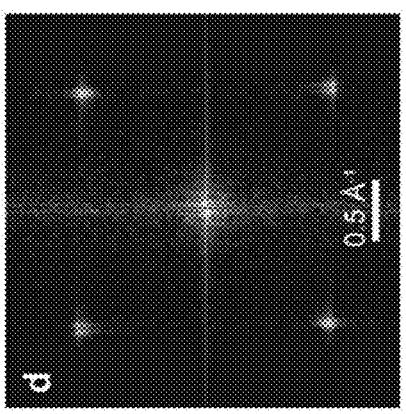

FIGS. 31A-31F show domains and splitting of the Bragg spots at room temperature. FIG. 31A-31C show STM topography images of the domain boundaries for 2 UC SnTe films, 3 UC SnTe films, and 4 UC SnTe films, respectively. FIG. 31D-31F show Fourier transform of the images in FIGS. 31A-31C, respectively.

Figures 32A, 32B, 32C:
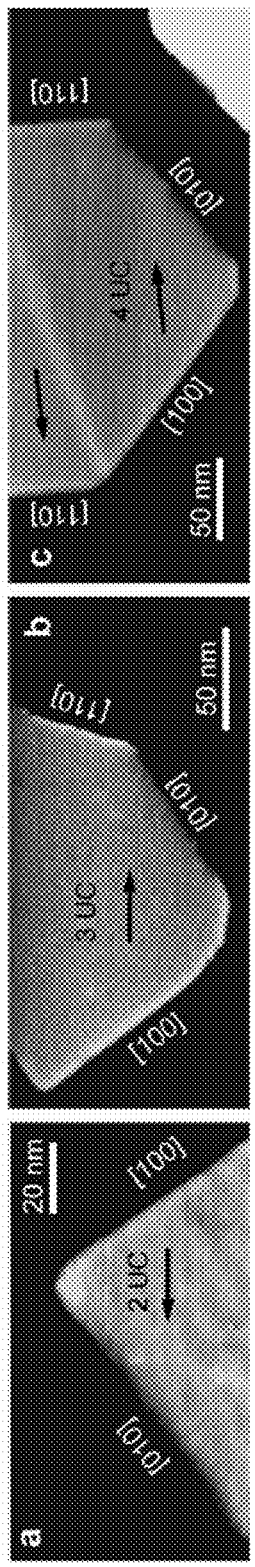
FIGS. 32A-32C illustrate band bending on the edges of 2 UC SnTe films, 3 UC SnTe films, and 4 UC SnTe films, respectively, at room temperature.

FIGS. 32A-32C illustrate band bending on the edges of 2 UC SnTe films, 3 UC SnTe films, and 4 UC SnTe films, respectively, at room temperature. The [100] and [010] edges are alternatively bright and dark, implying upward and downward band bending. The [110] edges are always bright because of the existence of dangling bonds. The tunneling parameters are −0.2 V, 10 pA for FIGS. 32A and 32B and −0.1 V, 10 pA for FIG. 32C. The brightness of the straight [110] edges do not obey the polarization direction because of the imbalanced local charge, i.e., the [100] edges has alternatively arranged Sn and Te atoms, while the [110] edge have only one type of atoms.

The domain walls and the splitting of the SnTe Bragg spots of 2~4 UC SnTe films at room temperature are shown in FIGS. 31A-31F. Although it is difficult to measure dI/dV spectra at room temperature, the band bending of 2~4 UC SnTe films can still be revealed from the topography images collected at certain bias, as FIGS. 32A-32C show. For thicker films from 2 to 4 UC, $T_c$ is even higher than the room temperature (RT).

Raman Spectroscopy of SnTe Films

Confocal micro-Raman measurements were performed on the SnTe films in a backscattering configuration using a Jobin Yvon HR800 single-grating-based micro-Raman system equipped with a volume Bragg grating low-wavenumber suite, a liquid-nitrogen cooled back-illuminated CCD detector, and a 633 nm laser (Melles Griot). The laser was focused onto the samples with a spot size of 510 μm². The laser power was maintained at a level of 1 mW and monitored with a power meter (Coherent Inc.).

Figures 33A, 33B:
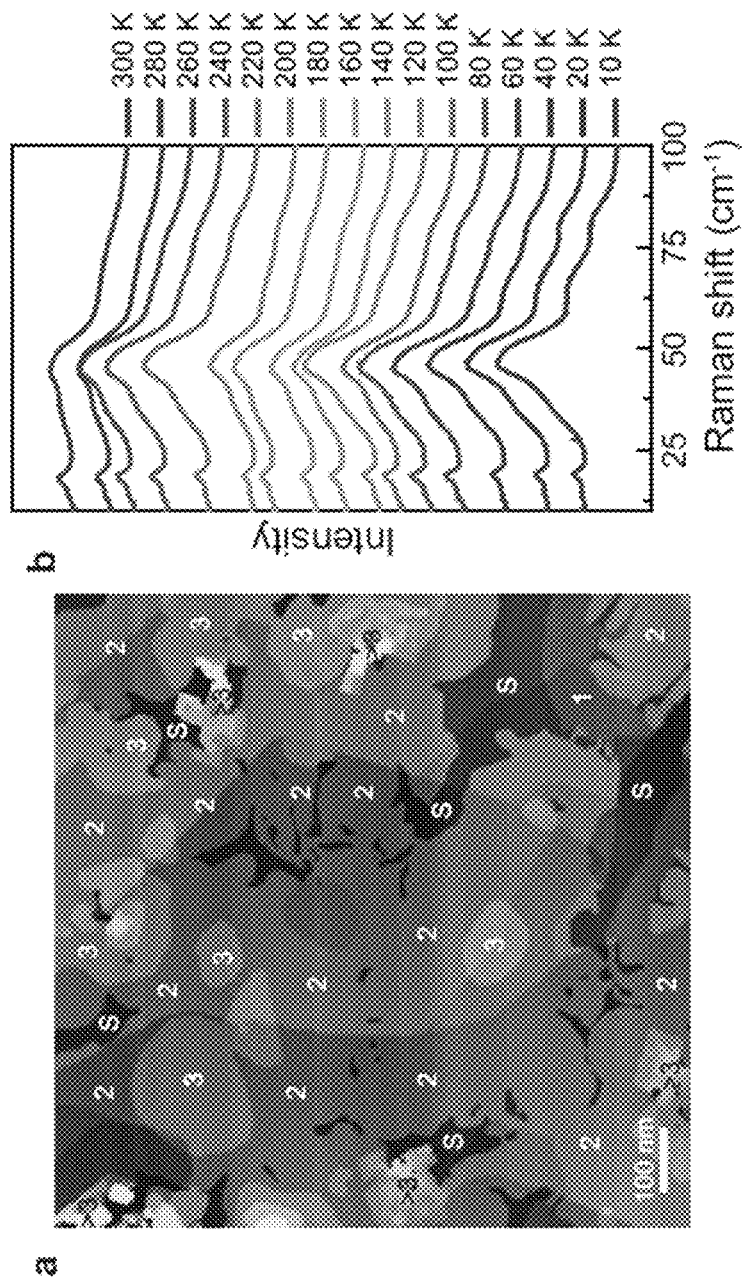
FIG. 33A shows STM topography images of a SnTe film including 2 UC sections and 3 UC sections.
FIG. 33B shows the Raman spectra of the SnTe film shown in FIG. 33A.

FIG. 33A shows STM topography images of a SnTe film including 2 UC sections and 3 UC sections. Film thickness is labeled on the image, in which "S" stands for substrate. The percentage of the substrate, 1 UC, 2 UC, 3 UC and >3 UC films are 12%, 2%, 66%, 13%, and 7%, respectively. FIG. 33B shows the Raman spectra of the SnTe film shown in FIG. 33A. The TO mode at about 46.8 cm⁻¹ persists up to room temperature. The peak position of the TO mode in the Raman spectra shifts slightly as temperature increases from 10 K to room temperature.

Figures 34A, 34B:
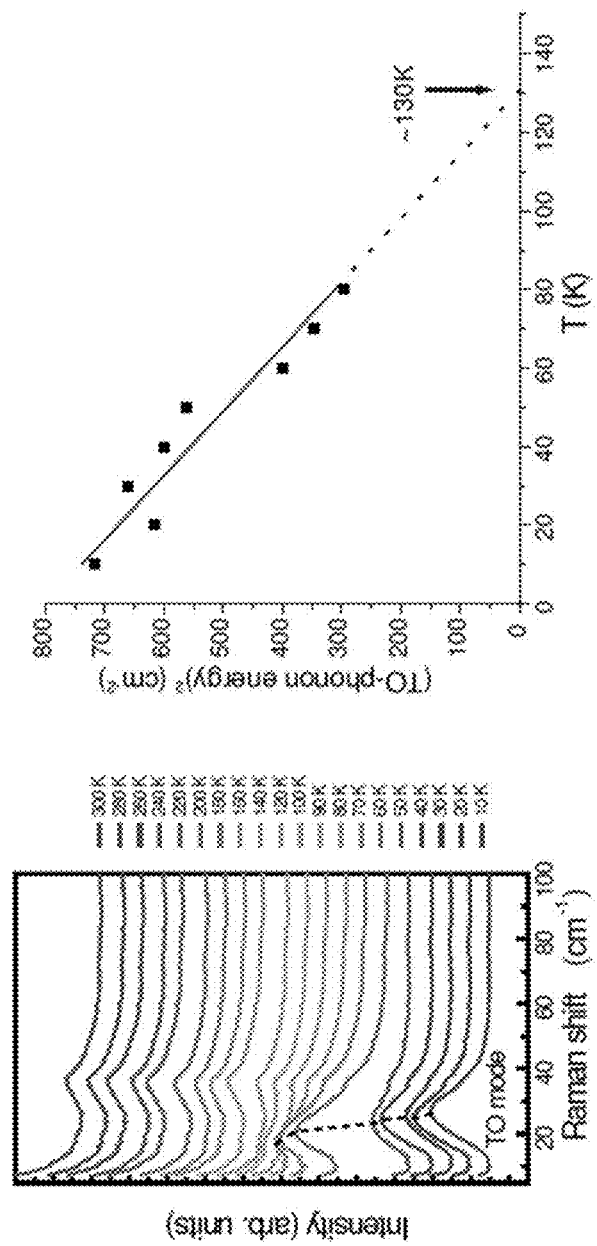
FIG. 34A shows Raman spectra of a SnTe film having a thickness of about 20 nm.
FIG. 34B shows curve fitting of the data shown in FIG. 34A to estimate the transition temperature of the SnTe film used in FIG. 31A.

FIG. 34A shows Raman spectra of a SnTe film having a thickness of about 20 nm. The TO mode at about 27 cm⁻¹ shows softening as the temperature increases. FIG. 34B shows curve fitting of the data shown in FIG. 34A to estimate the transition temperature of the SnTe film used in FIG. 31A. Using $\omega_{TO} \sim (T_c - T)^{1/2}$, the transition temperature $T_c$ of about 130 K is extracted from the fitting.

Figure 35B:
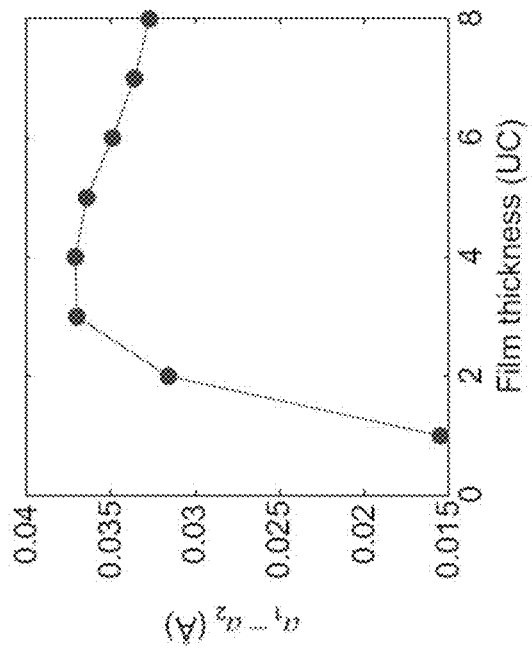
FIGS. 35A and 35B show calculated spontaneous polarization and lattice distortion, respectively, of SnTe films as a function of film thickness.
Figure 35A:
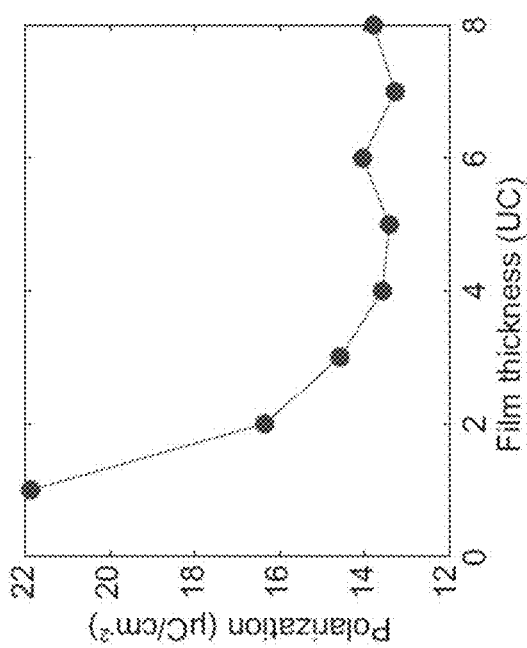

FIGS. 35A and 35B show calculated spontaneous polarization and lattice distortion, respectively of SnTe films as a function of film thickness. The polarization is defined as the polarization charge divided by the area of the cross section of the film.

The above Raman spectroscopy can directly probe the TO mode softening in ferroelectrics. For SnTe, the Raman signal is inactive above ferroelectric transition temperature $T_c$ because of the crystalline symmetry of the rock salt structure. Below $T_c$, the TO mode becomes Raman active and its frequency is given by $\omega_{TO} \sim (T_c - T)^{1/2}$. The Raman spectra from a sample with the thickness of about 20 nm reveals the softening of the TO mode as seen in FIG. 34A. The $T_c$ of the 20 nm thick extracted from the TO mode peak shift is found to be 130 K (FIG. 34B) and consistent with previous report.

The ultra-thin film for Raman experiments were grown at the substrate temperature of about 50° C. to make it as uniform as possible. As FIG. 33A shows, 66% area of the sample was covered by the 2 UC SnTe thin film, which would contribute most signal for the Raman spectra. As the spectra in FIG. 33B indicate, peak appears at about 46.8 cm⁻¹ at 10 K (the background of substrate has been checked). The peak persists up to room temperature and becomes broaden with lower magnitude. The peak position shifts to the higher energy comparing with the peak at about 26.8 cm⁻¹ Raman shift of 20 nm thick film. This shift is consistent with the conclusion from STM, which indicates the $T_c$ can be higher than room temperature. By the rough estimation from $\omega_{TO} \sim (T_c - T)^{1/2}$, the transition of 2 UC film is around 400 K. Generally speaking, reduced dimensionality leads to lower phase transition temperature. The strong ferroelectricity enhancement in atomic-layer-thick SnTe films is unusual and may have its origin in the lower Sn vacancy density, larger energy gap, and expanded in-plane lattice.

Parameters of SnTe Films Versus Film Thickness

Figure 36A:
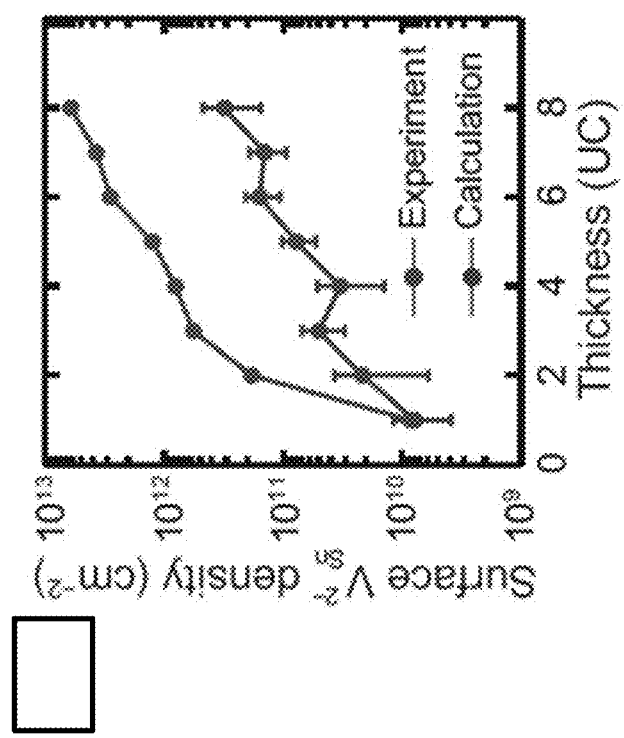
FIG. 36A shows measured and calculated Sn vacancy density in a SnTe film as a function of density at the growth temperature of about 450 K.
Figures 36B, 36C:
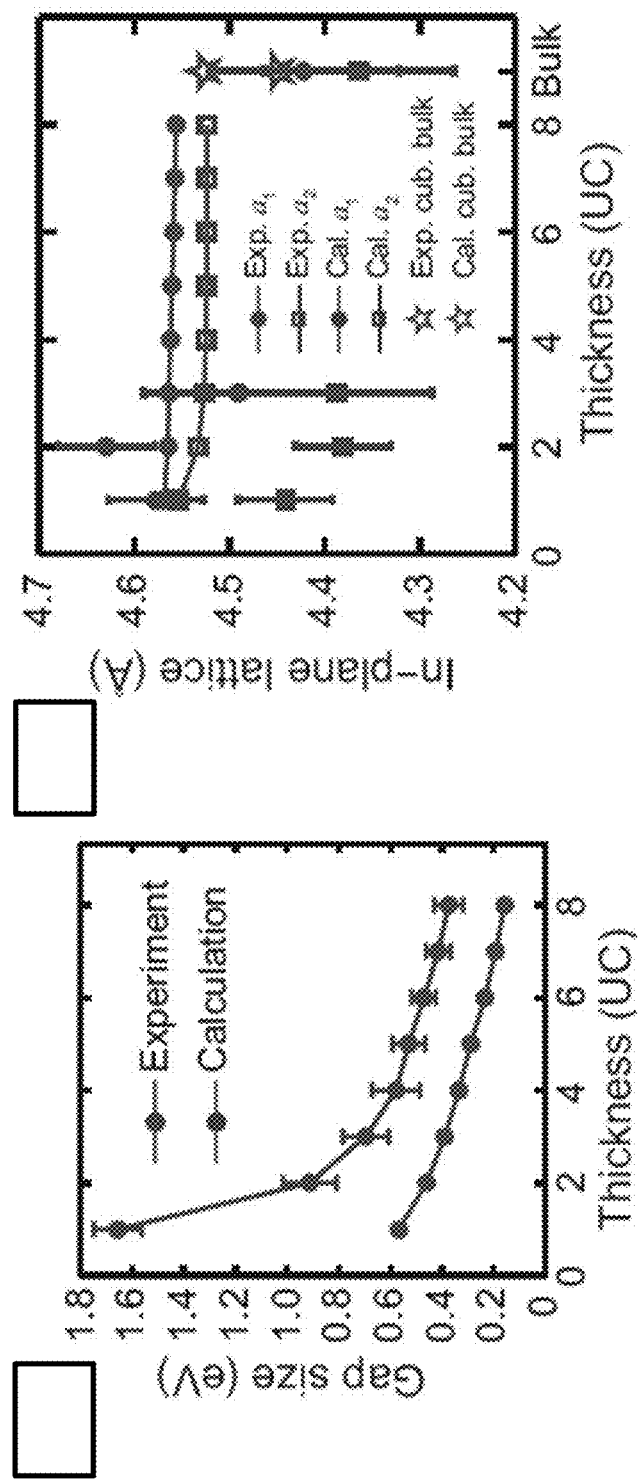
FIG. 36B shows measured and DFT calculated electronic band gap as function of film thickness.
FIG. 36C shows measured and calculated lattice constants as a function of film thickness.

FIG. 36A shows measured and calculated Sn vacancy density in a SnTe film as a function of density at the growth temperature of about 450K. FIG. 36B shows measured and DFT calculated thickness dependence of the electronic band gap. FIG. 36C shows the thickness dependence of the lattice constants determined by experiment data and DFT calculation.

The ferroelectric transition strongly depends on the screening effect of free carriers on the dipole-dipole interaction. For example, the bulk transition temperature of SnTe reaches 100 K when the carrier density has been reduced to $10^{20}$ cm⁻³. Both experiment and density functional theory (DFT) calculation (FIG. 36A) reveal that the density of Sn vacancies (and the free carriers) drops by 2~3 orders of magnitude in the SnTe ultra-thin film. So a higher $T_c$ is expected. It is worth to note that the $T_c$ of 1 UC film is lower than that of the 2~4 UC films, probably because the effect of reduced dimensionality becomes more prominent in the case of 1 UC. Besides the lower carrier density, larger energy gap also helps make SnTe thin film less conductive. The bulk IV-VI semiconductors such as SnTe usually have narrow band gaps. However, the gap of SnTe is dramatically increased when the film thickness is less than 8 UC as shown in FIG. 36B. The large band gap may facilitate the Tc enhancement.

Both experiment (with slightly large uncertainty) and the DFT calculation suggest that the in-plane lattice constants of SnTe increase when the film becomes thinner shown in FIG. 36C. The lattice constants can tune the interactions, including the long-range Coulomb attraction (LRA) and short-range repulsion (SRR), between ions. The LRA tends to drive the ions away from the centrosymmetric positions and favors the ferroelectric phase, while the SRR tends to push them back and reduce polarization. LRA and SRR scale as $r^{-3}$ and $r^{-n}$ (n~10), respectively, where r is the distance between a cation and an anion. Therefore, if the lattice expands, SRR is overwhelmed by LRA and ferroelectricity is enhanced.

Characterization of Memory Devices Using SnTe Films

Figures 37A, 37B, 37C:
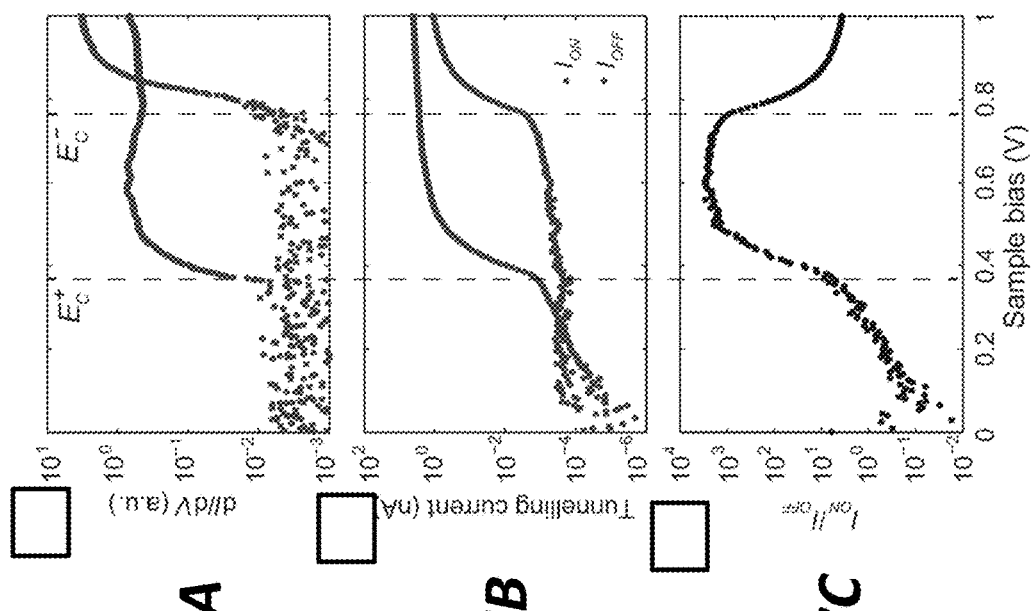
FIGS. 37A-37C show experimental results in a memory device using a 3 UC SnTe film as the storage medium.

FIG. 37A shows threshold voltages measured by STM. For a 3 UC film, $E^+_c$ and $E^-_c$ are measured by dI/dV (set point: 1.0 V, 100 pA) and found to be 0.36 eV and 0.76 eV, respectively. FIG. 37B shows simulations results of the reading process by STM. When the tip moves from one edge to another, the feedback loop of STM is turned off to maintain the same distance of tunneling junction. The tunneling current increases rapidly after the bias voltage reaches the corresponding threshold $E^+_c/e$ or $E^-_c/e$. Large ON/OFF ratio is achieved between $E^+_c/e$ and $E^-_c/e$. FIG. 37C shows the ON/OFF ratio as a function of the bias voltage for a 3 UC film.

To demonstrate the mechanism and simulate the reading process, the I-V curves (FIG. 36A) on the edges of a 3 UC SnTe film were measured by STM. During the measurement, the gap distance between tip and sample was fixed. From 0.5 to 0.7 eV, the ON/OFF ratio can reach as high as 3000 (FIG. 36C). Similar measurement is also performed on 1 UC film, which shows a lower ON/OFF ratio. Compared with the conventional FeRAM, where reading is destructive, the memory based on the in-plane polarization and tunneling does not reverse the polarization and is non-destructive.

Figure 38C:
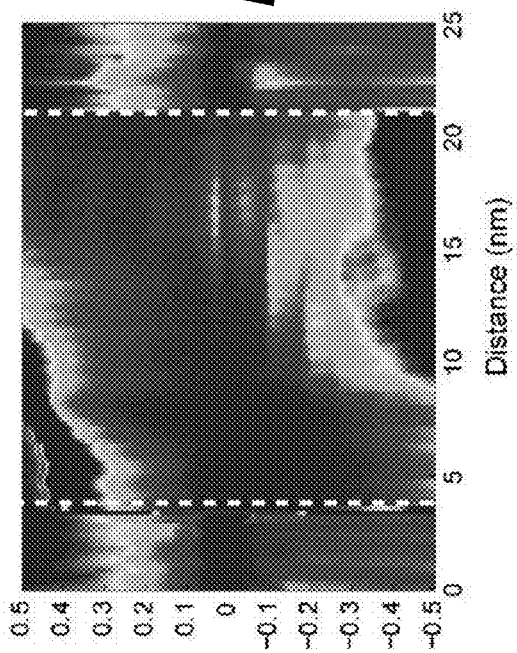
FIGS. 38B and 38C shows the dI/dV spectra of the image in FIG. 38A.
Figure 38B:
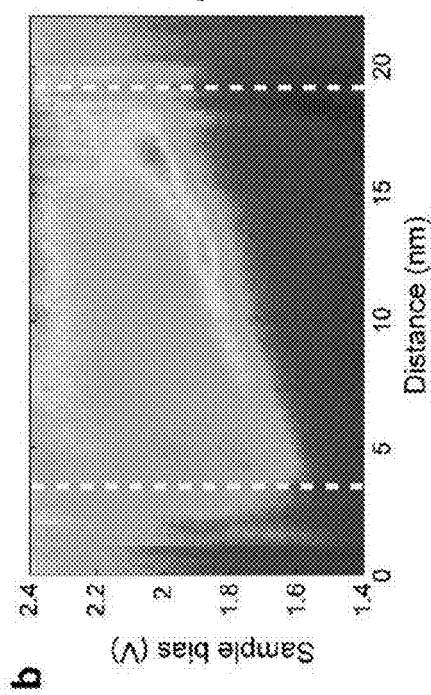
Figure 38A:
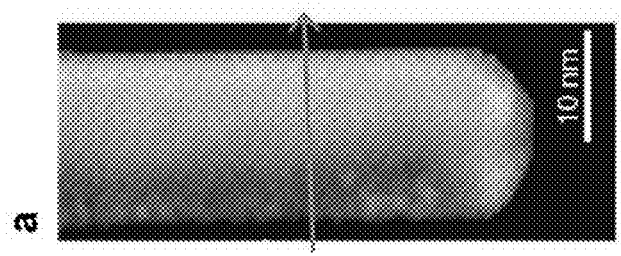
FIG. 38A shows an STM image of a 3 UC SnTe film having a width of about 15 nm.

Due to the high quality of the film, band bending is robust even if the size of the island is small. Since the depolarization field only influences the region of about 20 nm inside the edge, the magnitude of band bending is not likely to decrease until the island width is smaller than about 40 nm. FIG. 38A shows an STM image of a 3 UC SnTe film having a width of about 15 nm. FIGS. 38B and 38C shows the dI/dV spectra of the image in FIG. 38A. The band bending across this island is larger than 0.4 eV. Therefore, such atomic-thick ferroelectric islands are compatible with the miniaturized device size in modern electronics. Moreover, the fact that the ferroelectricity and band bending can exist in the SnTe nanowire of only 16 nm width shows the potential to fabricate devices with high density.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of" or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An apparatus, comprising:
    a ferroelectric semiconductor layer having an in-plane electric polarization component switchable between a first direction and a second direction opposite to the first direction;
    at least one writing electrode, in electrical communication with the ferroelectric semiconductor layer, to apply a writing voltage to the ferroelectric semiconductor layer, the writing voltage switching the in-plane electric polarization component between the first direction and the second direction; and
    at least one reading electrode, in electrical communication with the ferroelectric semiconductor layer, to apply a reading voltage to the ferroelectric semiconductor layer, the reading voltage measuring a tunneling current substantially perpendicular to the polarization direction of the in-plane electric polarization component.

2. The apparatus of claim 1, wherein the ferroelectric semiconductor layer comprises a IV-VI semiconductor.

3. The apparatus of claim 1, wherein the ferroelectric semiconductor layer comprises SnTe.

4. The apparatus of claim 1, wherein:
    the ferroelectric semiconductor layer has a first side and a second side opposite the first side, the first side and the second side defining a length of the ferroelectric semiconductor layer; and
    the at least one writing electrode comprises a first writing electrode disposed in proximity to the first side and a second writing electrode disposed in proximity to the second side.

5. The apparatus of claim 4, wherein the length of the ferroelectric semiconductor layer is about 10 nm to about 50 nm.

6. The apparatus of claim 1, wherein:
    the ferroelectric semiconductor layer has a first surface and a second surface opposite the first surface, the first surface and the second surface defining a thickness of the ferroelectric semiconductor layer; and
    the at least one reading electrode comprises a first reading electrode disposed on an edge of the first surface and a second reading electrode disposed on an edge of the second surface.

7. The apparatus of claim 6, wherein the thickness of the ferroelectric semiconductor layer is about 0.5 nm to about 5 nm.

8. The apparatus of claim 1, wherein the ferroelectric semiconductor layer comprises an epitaxial semiconductor layer and the at least one reading electrode comprises a graphene layer disposed in contact with the epitaxial semiconductor layer.

9. The apparatus of claim 1, further comprising:
    a current detector, operably coupled to the ferroelectric semiconductor layer, to measure the tunneling current.

10. The apparatus of claim 1, further comprising:
    an insulator layer disposed on the ferroelectric semiconductor layer, wherein the at least one writing electrode is disposed on the insulator layer.

11. A method, comprising:
    applying a first writing voltage to a ferroelectric semiconductor layer having an in-plane electric polarization component, the first writing voltage causing the in-plane electric polarization component to switch between a first direction and a second direction; and
    applying a reading voltage on the ferroelectric semiconductor layer to measure a tunneling current substantially perpendicular to the polarization direction of the in-plane electric polarization component.

12. The method of claim 11, wherein applying the first writing voltage comprises applying the first writing voltage across a first side of the ferroelectric semiconductor layer and a second side, opposite the first side, of the ferroelectric semiconductor layer, the first side and the second side defining a length of the ferroelectric semiconductor layer.

13. The method of claim 12, wherein applying the first writing voltage comprises applying the first writing voltage across the length of about 10 nm to about 50 nm.

14. The method of claim 11, wherein applying the reading voltage comprises applying the reading voltage across an edge of a first surface of the ferroelectric semiconductor layer and an edge of a second surface, opposite the first surface, of the ferroelectric semiconductor layer, the first surface and the second surface defining a thickness of the ferroelectric semiconductor layer.

15. The method of claim 14, wherein applying the reading voltage comprises applying the reading voltage across the thickness of about 0.5 nm to about 5 nm.

16. The method of claim 14, wherein applying the reading voltage comprises applying the reading voltage via an electrode in electrical communication with the first surface of the ferroelectric semiconductor layer and a graphene layer disposed in electrical communication with the second surface of the ferroelectric semiconductor layer.

17. The method of claim 11, further comprising:
    measuring the tunneling current to determine the polarization direction of the in-plane electric polarization component.

18. The method of claim 17, wherein measuring the tunneling current comprises:
    measuring a first tunneling current when the in-plane electric polarization component is oriented in the first direction; and
    measuring a second tunneling current at least 100 times greater than the first tunneling current when the in-plane electric polarization component is oriented in the second direction.

19. The method of claim 17, wherein measuring the tunneling current comprises measuring the tunneling current at a temperature substantially equal to or greater than 150 K.

20. The method of claim 17, wherein measuring the tunneling current comprises measuring a first tunneling current when the first writing voltage is applied on the ferroelectric semiconductor layer and the method further comprises:
    removing the first writing voltage applied to the ferroelectric semiconductor layer after measuring the first tunneling current; and
    measuring a second tunneling current after removing the first voltage.

21. The method of claim 11, further comprising:
applying a second writing voltage to the ferroelectric semiconductor layer, the second writing voltage causing the polarization direction of the in-plane electric polarization component to switch between the second direction and the first direction.

22. A random access memory device, comprising:
a ferroelectric semiconductor layer having an in-plane polarization component switchable between a first direction and a second direction opposite to the first direction, the ferroelectric semiconductor layer having a thickness substantially equal to or less than 10 nm and a length of about 10 nm to about 50 nm;
an insulator layer disposed on a first surface of the ferroelectric semiconductor layer;
a writing electrode, disposed on a first side of the insulator layer, to apply a writing voltage to the ferroelectric semiconductor layer, the writing voltage switching the in-plane polarization component between the first direction and the second direction;
a ground electrode disposed on a second side, opposite the first side, of the insulator layer; and
a graphene layer, disposed on a second surface, opposite the first surface, of the ferroelectric semiconductor layer, to apply a reading voltage, with respect to the ground electrode, to the ferroelectric semiconductor layer to measure a tunneling current substantially perpendicular to the first surface of the ferroelectric semiconductor layer.

* * * * *